(12) United States Patent
Matsuda

(10) Patent No.: US 8,994,094 B2
(45) Date of Patent: Mar. 31, 2015

(54) NONVOLATILE SEMICONDUCTOR MEMORY DEVICE AND METHOD FOR MANUFACTURING SAME

(75) Inventor: Toru Matsuda, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 125 days.

(21) Appl. No.: 13/235,429

(22) Filed: Sep. 18, 2011

(65) Prior Publication Data

US 2012/0241842 A1 Sep. 27, 2012

(30) Foreign Application Priority Data

Mar. 24, 2011 (JP) .................................. 2011-065315

(51) Int. Cl.
*H01L 29/792* (2006.01)
*H01L 27/115* (2006.01)
*H01L 21/28* (2006.01)

(52) U.S. Cl.
CPC .... *H01L 27/11582* (2013.01); *H01L 21/28282* (2013.01)
USPC .................... 257/324; 257/326; 257/E29.309

(58) Field of Classification Search
USPC .................. 257/314–326, 506, 508, E21.423, 257/E27.06; 438/257–267; 365/185.01–185.33
See application file for complete search history.

(56) References Cited

U.S. PATENT DOCUMENTS

| | | | |
|---|---|---|---|
| 5,811,315 A * | 9/1998 | Yindeepol et al. | 438/405 |
| 2002/0004249 A1 * | 1/2002 | Kawakubo | 438/3 |
| 2009/0127636 A1 * | 5/2009 | Smayling et al. | 257/402 |
| 2009/0184367 A1 * | 7/2009 | Fujimoto | 257/329 |
| 2010/0013049 A1 * | 1/2010 | Tanaka et al. | 257/532 |
| 2010/0117137 A1 | 5/2010 | Fukuzumi et al. | |
| 2010/0171162 A1 * | 7/2010 | Katsumata et al. | 257/314 |
| 2010/0207190 A1 * | 8/2010 | Katsumata et al. | 257/319 |
| 2011/0180866 A1 | 7/2011 | Matsuda et al. | |

FOREIGN PATENT DOCUMENTS

JP  2010-114370 A  5/2010

OTHER PUBLICATIONS

U.S. Appl. No. 12/955,214, filed Nov. 29, 2010, Toru Matsuda.
Japanese Office Action issued Jul. 18, 2013 in Patent Application No. 2011-065315 with English Translation.

* cited by examiner

*Primary Examiner* — Mark Tornow
*Assistant Examiner* — Abbigale Boyle
(74) *Attorney, Agent, or Firm* — Oblon, McClelland, Maier & Neustadt, L.L.P.

(57) ABSTRACT

According to one embodiment, a nonvolatile semiconductor memory device includes first and second stacked body, first and second semiconductor pillars, a connecting portion, a first memory film, and a dividing portion. The stacked bodies include a plurality of electrode films stacked along a first axis and as interelectrode insulating film provided between the electrode films. The first and second semiconductor pillars penetrate through the first and second stacked bodies along the first axis, respectively. The connecting portion electrically connects the first and second semiconductor pillars. The first memory film is provided between the electrode film and the semiconductor pillar. The dividing portion electrically divides the first and second electrode films from each other between the first semiconductor pillar and the second semiconductor pillar, is in contact with the connecting portion, and includes a stacked film including a material used for the first memory film.

9 Claims, 17 Drawing Sheets

US 8,994,094 B2

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2011-065315, filed on Mar. 24, 2011; the entire contents of which are incorporated herein by reference.

FIELD

Embodiments described herein relate generally to a nonvolatile semiconductor memory device and a method for manufacturing the same.

BACKGROUND

To increase the memory capacity of a nonvolatile semiconductor memory device, a three-dimensional stacked memory has been proposed. The three-dimensional stacked memory includes a stacked body with insulating films and electrode films alternately stacked therein, silicon pillars penetrating through the stacked body in the stacking direction, and a charge accumulation layer (memory layer) provided between the silicon pillar and the electrode film. Thus, a memory cell is provided at the intersection between the silicon pillar and each electrode film. Furthermore, it is also possible to use a U-shaped memory string connecting two silicon pillars on the substrate side.

In such a three-dimensional stacked memory, there is demand for reducing the number of manufacturing steps and reducing the manufacturing cost.

DETAILED DESCRIPTION

Figure 1:
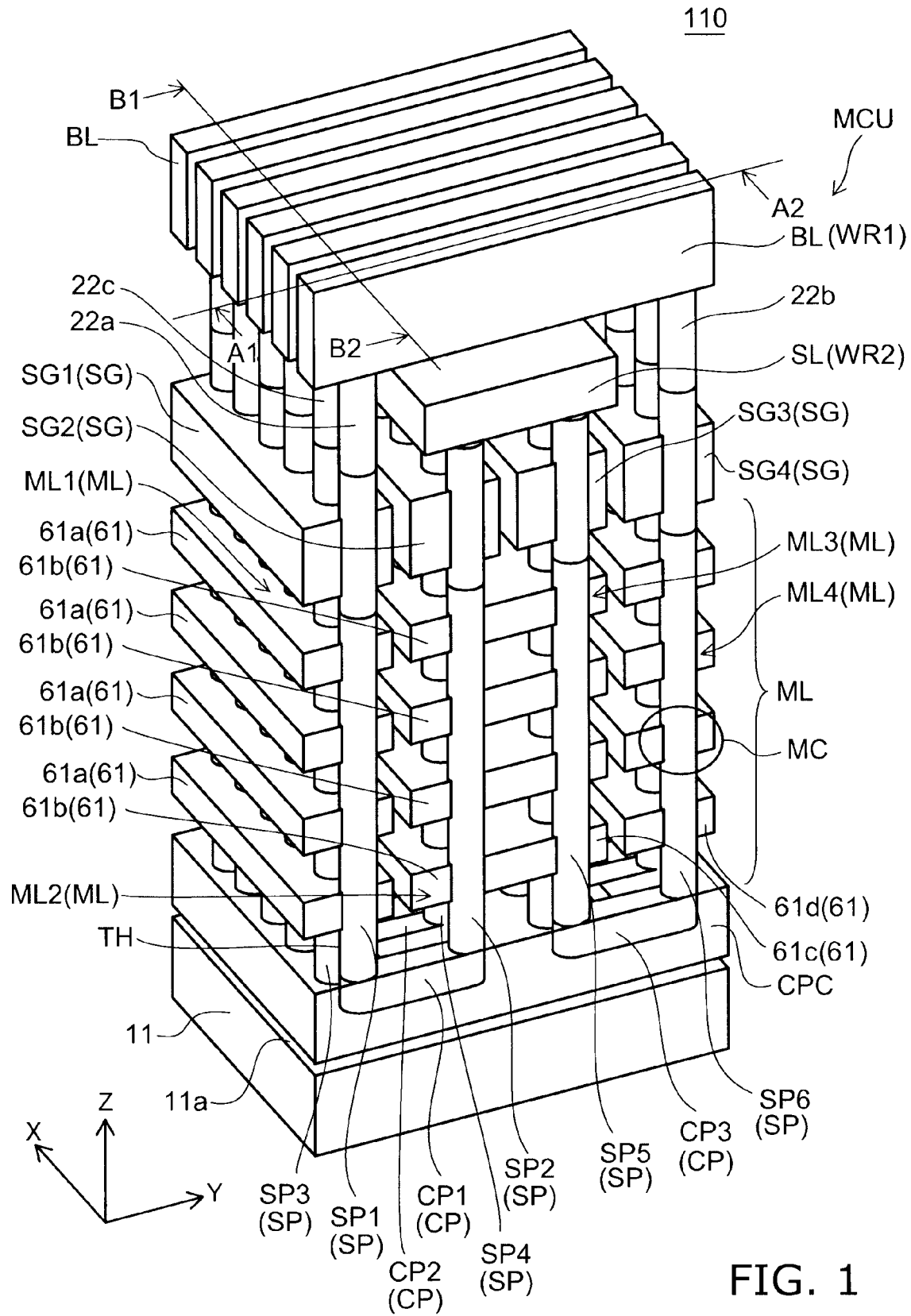
FIG. 1 is a schematic perspective view illustrating the configuration of part of a nonvolatile semiconductor memory device according to a first embodiment.

According to one embodiment, a nonvolatile semiconductor memory device includes a first stacked body, a first semiconductor pillar, a second stacked body, a second semiconductor pillar, a connecting portion, a first memory film, and a dividing portion. The first stacked body includes a plurality of first electrode films stacked along a first axis and a first interelectrode insulating film provided between two layers of the first electrode films neighboring along the first axis. The first semiconductor pillar penetrates through the first stacked body along the first axis. The second stacked body is juxtaposed with the first stacked body along a second axis orthogonal to the first axis and including a plurality of second electrode films stacked along the first axis and a second interelectrode insulating film provided between two layers of the second electrode films neighboring along the first axis. The second semiconductor pillar penetrates through the second stacked body along the first axis. The connecting portion electrically connects the first semiconductor pillar and the second semiconductor pillar. The first memory film is provided between the first electrode films and the first semiconductor pillar and between the second electrode films and the second semiconductor pillar. The dividing portion electrically divides the first electrode films and the second electrode films from each other between the first semiconductor pillar and the second semiconductor pillar, is in contact with the connecting portion, and includes a stacked film including a material used for the first memory film.

According to one other embodiment, a method for manufacturing a nonvolatile semiconductor memory device is disclosed. The device includes a first stacked body, a first semiconductor pillar, a second stacked body, a second semiconductor pillar, a connecting portion, a connecting portion conductive layer, a first memory film, and a dividing portion. The first stacked body includes a plurality of first electrode films stacked along a first axis and a first interelectrode insulating film provided between two layers of the first electrode films neighboring along the first axis. The first semiconductor pillar penetrates through the first stacked body along the first axis. The second stacked body is juxtaposed with the first stacked body along a second axis orthogonal to the first axis and includes a plurality of second electrode films stacked along the first axis and a second interelectrode insulating film provided between two layers of the second electrode films neighboring along the first axis. The second semiconductor pillar penetrates through the second stacked body along the first axis. The connecting portion electrically connects the first semiconductor pillar and the second semiconductor pillar. The connecting portion conductive layer is opposed to the connecting portion. The first memory film is provided between the first electrode films and the first semiconductor pillar, between the second electrode films and the second semiconductor pillar, and between the connecting portion and the connecting portion conductive layer. The dividing portion electrically divides the first electrode films and the second electrode films from each other between the first semiconductor pillar and the second semiconductor pillar. The method can include burying a sacrificial layer in a connecting portion trench. The connecting portion trench is provided in a connecting portion conductive film serving as the connecting portion conductive layer. The connecting portion is to be formed in the in the connecting portion trench. The method can include forming a stacked body preform serving as the first stacked body and the second stacked body on the sacrificial layer. The method can include forming a first through hole penetrating through the stacked body preform along the first axis and reaching the sacrificial layer, a second through hole juxtaposed with the first through hole along the second axis, penetrating through the stacked body preform along the first axis and reaching the sacrificial layer, and a slit penetrating through the stacked body preform along the first axis, reaching the sacrificial layer between the first through hole and the second through hole and dividing the stacked body perform. The method can include removing the sacrificial layer through at least one of the first through hole, the second through hole, and the slit to expose an inner wall surface of the connecting portion trench. The method can include forming the first memory film by forming a stacked film on each inner wall surface of the first through hole, the second through hole, and the connecting portion trench, and simultaneously forming the dividing portion by burying at least part of the stacked film inside the slit. In addition, the method can include forming the first semiconductor pillar, the second semiconductor pillar, and the connecting portion by burying a semiconductor material in a remaining space of the first through hole, the second through hole, and the connecting portion trench.

According to one other embodiment, a method for manufacturing a nonvolatile semiconductor memory device is disclosed. The device includes a first stacked body, a first semiconductor pillar, a second stacked body, a second semiconductor pillar, a connecting portion, a connecting portion conductive layer, a first memory film, and a dividing portion. The first stacked body includes a plurality of first electrode films stacked along a first axis and a first interelectrode insulating film provided between two layers of the first electrode films neighboring along the first axis. The first semiconductor pillar penetrates through the first stacked body along the first axis. The second stacked body is juxtaposed with the first stacked body along a second axis orthogonal to the first axis and includes a plurality of second electrode films stacked along the first axis and a second interelectrode insulating film provided between two layers of the second electrode films neighboring along the first axis. The second semiconductor pillar penetrates through the second stacked body along the first axis. The connecting portion electrically connects the first semiconductor pillar and the second semiconductor pillar. The connecting portion conductive layer is opposed to the connecting portion. The first memory film is provided between the first electrode films and the first semiconductor pillar, between the second electrode films and the second semiconductor pillar, and between the connecting portion and the connecting portion conductive layer. The dividing portion electrically divides the first electrode films and the second electrode films from each other between the first semiconductor pillar and the second semiconductor pillar. The method can include burying a sacrificial layer in a connecting portion trench. The connecting portion trench is provided in a connecting portion conductive film serving as the connecting portion conductive layer. The connecting portion is to be formed in the connecting portion trench. The method can include forming a stacked structure by alternately forming first films and second films on the sacrificial layer. The second films have an etching rate higher than an etching rate of the first films. The method can include forming a first through hole penetrating through the stacked structure along the first axis and reaching the sacrificial layer, a second through hole juxtaposed with the first through hole along the second axis, penetrating through the stacked structure along the first axis and reaching the sacrificial layer, and a slit penetrating through the stacked structure along the first axis, reaching the sacrificial layer between the first through hole and the second through hole and dividing the stacked structure. The method can include forming the dividing portion by burying an insulating material inside the slit. The method can include removing the second films and the sacrificial layer through the first through hole and the second through hole while leaving the first films. The method can include forming the first memory film by forming a stacked film on each inner wall surface of the first through hole, the second through hole, and the connecting portion trench, and simultaneously forming the first interelectrode insulating film and the second interelectrode insulating film by burying at least a part of the stacked film in a space formed by the removing the second films. In addition, the method can include forming the first semiconductor pillar, the second semiconductor pillar, and the connecting portion by burying a semiconductor material in a remaining space of the first through hole, the second through hole, and the connecting portion trench.

Embodiments will now be described in detail with reference to the drawings.

The drawings are schematic or conceptual; and the relationships between the thickness and width of portions, the proportions of sizes among portions, etc., are not necessarily the same as the actual values thereof. Further, the dimensions and proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIG. 1 is a schematic perspective view illustrating the configuration of part of a nonvolatile semiconductor memory device according to a first embodiment. In this figure, for clarity of illustration, conductive portions are shown, and illustration of insulating portions is omitted.

As shown in FIG. 1, the nonvolatile semiconductor memory device 110 according to the embodiment includes a memory cell array unit MCU. The memory cell array unit MCU includes a plurality of memory cells MC.

The memory cell array unit MCU is provided on e.g. the major surface 11a of a substrate 11.

The substrate 11 is e.g. a semiconductor substrate. The substrate 11 is e.g. a silicon substrate. Alternatively, the substrate 11 can be e.g. a semiconductor layer provided on an arbitrary substrate. In the embodiments, the substrate 11 is arbitrary.

Here, the axis perpendicular to the major surface 11a of the substrate 11 is defined as Z axis (first axis). One axis perpendicular to the Z axis is defined as Y axis (second axis). The axis perpendicular to the Z axis and the Y axis is defined as X axis (third axis).

As shown in FIG. 1, the memory cell array unit MCU includes a plurality of stacked bodies ML (e.g., first to fourth stacked bodies ML1-ML4). The plurality of stacked bodies ML extend along e.g. the X axis. The plurality of stacked bodies ML are arranged along e.g. the Y axis. The plurality of stacked bodies ML each include a plurality of electrode films 61 stacked along the Z axis, and interelectrode insulating films (not shown in this figure) each provided between two electrode films 61 neighboring along the Z axis.

For clarity of illustration, FIG. 1 shows the case where the number of electrode films 61 is four. However, in the embodiments, the number of electrode films 61 is arbitrary.

The term "stacked" used herein refers not only to the case where the layers are stacked in contact with each other, but also to the case where the layers are stacked with other components interposed therebetween.

The memory cell array unit MCU includes a plurality of semiconductor pillars SP. For instance, the plurality of semiconductor pillars SP are first to sixth semiconductor pillars SP1-SP6.

The second semiconductor pillar SP2 is juxtaposed with the first semiconductor pillar SP1 along the Y axis.

The third semiconductor pillar SP3 is juxtaposed with the first semiconductor pillar SP1 along the X axis.

The fourth semiconductor pillar SP4 is juxtaposed with the third semiconductor pillar SP3 along the Y axis, and juxtaposed with the second semiconductor pillar SP2 along the X axis.

The fifth semiconductor pillar SP5 and the sixth semiconductor pillar SP6 are juxtaposed with the first semiconductor pillar SP1 along the Y axis. The second semiconductor pillar SP2 is located between the first semiconductor pillar SP1 and the sixth semiconductor pillar SP6. The fifth semiconductor pillar SP5 is located between the second semiconductor pillar SP2 and the sixth semiconductor pillar SP6.

The bottom portion of the first semiconductor pillar SP1 and the bottom portion of the second semiconductor pillar SP2 are connected by a first connecting portion CP1 (connecting portion CP). The bottom portion of the third semiconductor pillar SP3 and the bottom portion of the fourth semiconductor pillar SP4 are connected by a second connecting portion CP2. The bottom portion of the fifth semiconductor pillar SP5 and the bottom portion of the sixth semiconductor pillar SP6 are connected by a third connecting portion CP3.

The end opposite to the bottom portion of the first semiconductor pillar SP1 and the end opposite to the bottom portion of the sixth semiconductor pillar SP6 are connected to one of a plurality of bit lines BL by a contact via 22a. The end opposite to the bottom portion of the second semiconductor pillar SP2 and the end opposite to the bottom portion of the fifth semiconductor pillar SP5 are connected to a source line SL.

The end opposite to the bottom portion of the third semiconductor pillar SP3 is connected by a contact via 22c to a bit line BL of the plurality of bit lines BL. This bit line BL is different from the bit line BL to which the first semiconductor pillar SP1 and the sixth semiconductor pillar SP6 are connected. The end opposite to the bottom portion of the fourth semiconductor pillar SP4 is connected to the source line SL.

The plurality of semiconductor pillars SP each penetrate through the plurality of stacked bodies ML along the Z axis.

The stacked body ML penetrated by the first semiconductor pillar SP1 and the third semiconductor pillar SP3 is defined as first stacked body ML1. The stacked body ML penetrated by the sixth semiconductor pillar SP6 is defined as fourth stacked body ML4. The second semiconductor pillar SP2, the fourth semiconductor pillar SP4, and the fifth semiconductor pillar SP5 penetrate through the same stacked body ML. For convenience, the portion of the stacked body ML penetrated by the second semiconductor pillar SP2 and the fourth semiconductor pillar SP4 is referred to as second stacked body ML2, and the portion of the stacked body ML penetrated by the fifth semiconductor pillar SP5 is referred to as third stacked body ML3. The second stacked body ML2 is continuous to the third stacked body ML3.

A first select gate electrode SG1 is provided between the first stacked body ML1 and the bit line BL.

A second select gate electrode SG2 is provided between the second stacked body ML2 and the source line SL.

A third select gate electrode SG3 is provided between the third stacked body ML3 and the source line SL.

A fourth select gate electrode SG4 is provided between the fourth stacked body ML4 and the bit line BL.

The plurality of select gate electrodes SG (first to fourth select gate electrodes SG1-SG4) extend along the X axis.

The first select gate electrode SG1 is penetrated by the first semiconductor pillar SP1 and the third semiconductor pillar SP3.

The second select gate electrode SG2 is penetrated by the second semiconductor pillar SP2 and the fourth semiconductor pillar SP4.

The third select gate electrode SG3 is penetrated by the fifth semiconductor pillar SP5.

The fourth select gate electrode SG4 is penetrated by the sixth semiconductor pillar SP6.

As shown in FIG. 1, the plurality of semiconductor pillars SP are provided in a matrix configuration along the X and Y axes. A memory cell MC is formed at each intersection where the plurality of electrode films 61 stacked along the Z axis cross the plurality of semiconductor pillars SP. The memory cells MC are provided in a three-dimensional matrix configuration along the Z, X, and Y axes.

The connecting portion CP is made of e.g. a semiconductor material used for the semiconductor pillar SP.

The memory cell array unit MCU further includes a connecting portion conductive layer CPC opposed to the connecting portion CP (e.g., first to third connecting portions CP1-CP3). By controlling the potential of the connecting portion conductive layer CPC, a pair of semiconductor pillars SP connected to each connecting portion CP are electrically connected to each other. The connected pair of semiconductor pillars SP serve as one memory string.

Figure 2:
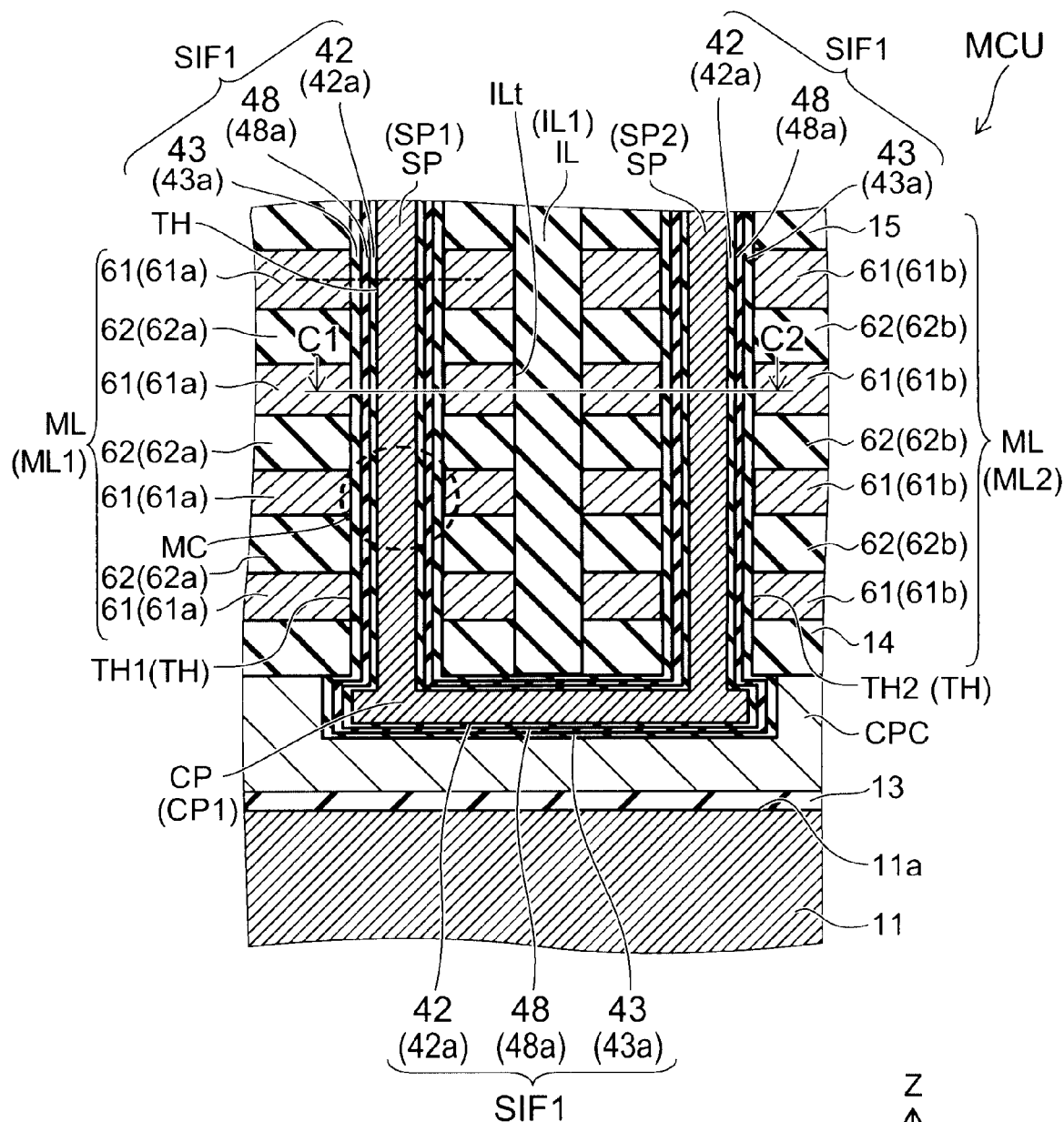
FIG. 2 is a schematic sectional view illustrating the configuration of the nonvolatile semiconductor memory device according to the first embodiment.
Figure 3:
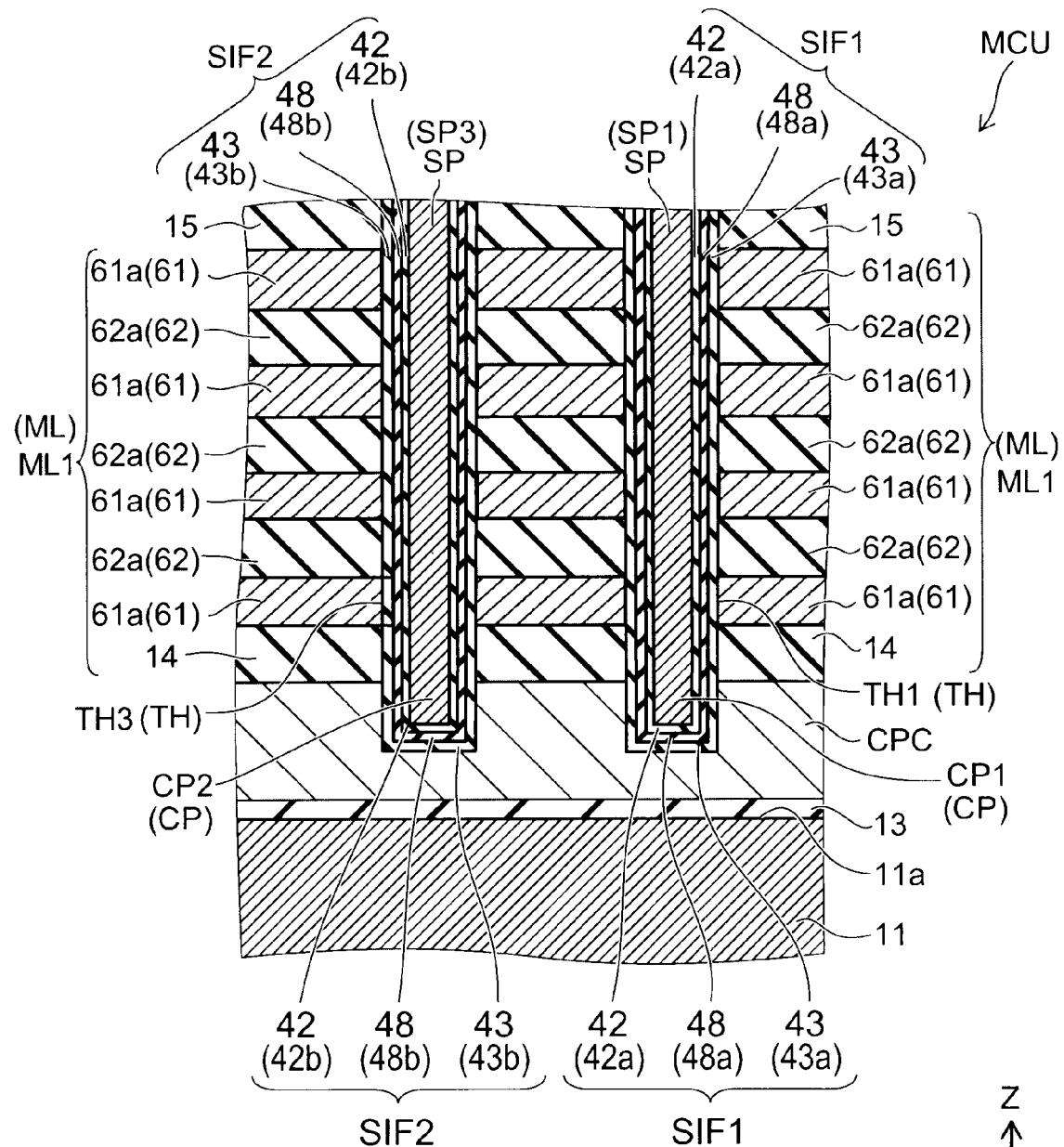
FIG. 3 is a schematic sectional view illustrating the configuration of the nonvolatile semiconductor memory device according to the first embodiment.
Figure 4:
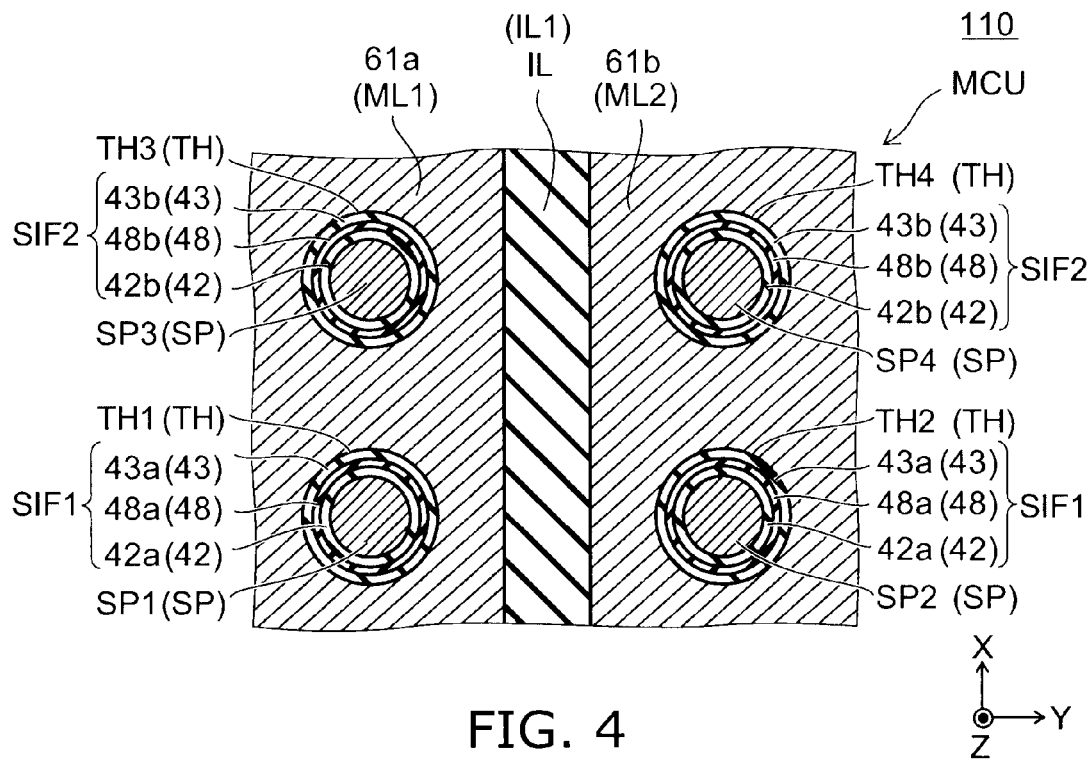
FIG. 4 is a schematic sectional view illustrating the configuration of the nonvolatile semiconductor memory device according to the first embodiment.

FIGS. 2, 3, and 4 illustrate the configuration of the memory cell array unit MCU of the nonvolatile semiconductor memory device 110. More specifically, FIG. 2 illustrates part of the cross section taken along line A1-A2 of FIG. 1. FIG. 3 illustrates part of the cross section taken along line B1-B2 of FIG. 1. FIG. 4 is a sectional view of part of the memory cell array unit MCU cut along the X-Y plane and corresponds to the cross section taken along line C1-C2 of FIG. 2.

As shown in FIGS. 2 and 4, the first stacked body ML1 includes a plurality of first electrode films 61a stacked along the Z axis, and first interelectrode insulating films 62a each provided between two first electrode films 61a neighboring along the Z axis. For instance, a first through hole TH1 extending along the Z axis is provided in the first stacked body ML1, and the first semiconductor pillar SP1 is buried inside the first through hole TH1.

The second stacked body ML2 is juxtaposed with the first stacked body ML1 along e.g. the Y axis. The second stacked body ML2 includes a plurality of second electrode films 61b stacked along the Z axis, and second interelectrode insulating films 62b each provided between two second electrode films 61b neighboring along the Z axis. For instance, a second through hole TH2 extending along the Z axis is provided in the second stacked body ML2, and the second semiconductor pillar SP2 is buried inside the second through hole TH2.

The memory cell array unit MCU further includes a first memory film SIF1. The first memory film SIF1 is provided between the plurality of first electrode films 61a and the first semiconductor pillar SP1, between the plurality of second electrode films 61b and the second semiconductor pillar SP2, and between the first connecting portion CP1 and the connecting portion conductive layer CPC.

The first memory film SIF1 surrounds the first semiconductor pillar SP1, the second semiconductor pillar SP2, and the first connecting portion CP1.

For instance, the first memory insulating film SIF1 includes a first inner insulating film 42a (inner insulating film 42) provided around the first semiconductor pillar SP1, the second semiconductor pillar SP2, and the first connecting portion CP1, a first charge retention layer 48a (charge retention layer 48) provided around the first inner insulating film 42a, and a first outer insulating film 43a (outer insulating film 43) provided around the first charge retention layer 48a.

As shown in FIG. 2, the memory cell array unit MCU further includes a first dividing portion IL1 (dividing portion IL) dividing the first stacked body ML1 and the second stacked body ML2. The first dividing portion IL1 electrically divides the plurality of first electrode films 61a and the plurality of second electrode films 61b from each other between the first semiconductor pillar SP1 and the second semiconductor pillar SP2. The first dividing portion IL1 is in contact with the first connecting portion CP1. The first dividing portion IL1 includes a stacked film including the material used for the first memory film SIF1.

The first dividing portion IL1 includes a portion extending along the X axis. The first dividing portion IL1 further electrically divides the plurality of first electrode films 61a and the plurality of second electrode films 61b from each other between the third semiconductor pillar SP3 and the fourth semiconductor pillar SP4.

As illustrated in FIG. 2, an insulating film 13 is provided between the substrate 11 and the connecting portion conductive layer CPC. An interlayer insulating film 14 is provided between the plurality of electrode films 61 and the connecting portion conductive layer CPC. Furthermore, the memory cell array unit MCU includes an interlayer insulating film 15. The plurality of electrode films 61 are located between the interlayer insulating film 14 and the interlayer insulating film 15. The interlayer insulating films 14 and 15 are also included in the stacked body ML.

As shown in FIGS. 3 and 4, a second memory film SIF2 and a second connecting portion CP2 are provided.

The second memory film SIF2 is provided between the plurality of first electrode films 61a and the third semiconductor pillar SP3, between the plurality of second electrode films 61b and the fourth semiconductor pillar SP4, and between the second connecting portion CP2 and the connecting portion conductive layer CPC.

The second memory film SIF2 surrounds the third semiconductor pillar SP3, the fourth semiconductor pillar SP4, and the second connecting portion CP2.

The second memory insulating film SIF2 includes a second inner insulating film 42b (inner insulating film 42) provided around the third semiconductor pillar SP3, the fourth semiconductor pillar SP4, and the second connecting portion CP2, a second charge retention layer 48b (charge retention layer 48) provided around the second inner insulating film 42b, and a second outer insulating film 43b (outer insulating film 43) provided around the second charge retention layer 48b.

The first dividing portion IL1 further electrically divides the plurality of first electrode films 61a and the plurality of second electrode films 61b from each other between the third semiconductor pillar SP3 and the fourth semiconductor pillar SP4.

The electrode film 61 and the connecting portion conductive layer CPC are made of e.g. polysilicon. The interelectrode insulating film 62, the inner insulating film 42, and the outer insulating film 43 are made of e.g. silicon oxide.

The charge retention film 48 is made of e.g. silicon nitride. However, the charge retention film 48 can be made of an arbitrary insulating material. Alternatively, the charge retention film 48 may be made of a conductive material. In this case, the charge accumulation film 48 is divided between the memory cells MC (electrode films 61) neighboring along the Z axis. The charge retention film 48 can function as a portion for accumulating charge to store information in the memory cell MC. The inner insulating film 42 functions as e.g. a tunnel insulating film. The outer insulating film 43 functions as a block insulating film.

The memory cell MC is e.g. a transistor having the MONOS configuration. The plurality of electrode films 61 function as word electrodes.

Figure 5:
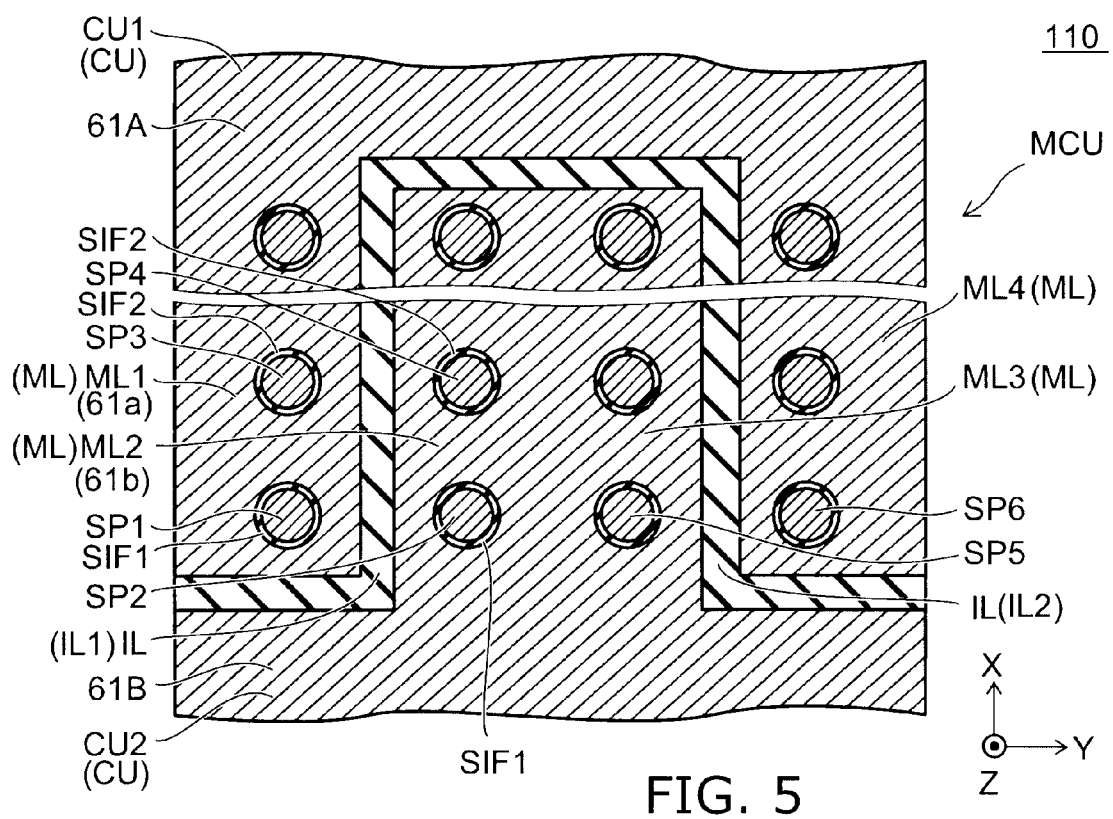
FIG. 5 is a schematic plan view illustrating the configuration of part of the nonvolatile semiconductor memory device according to the first embodiment.

FIG. 5 is a schematic plan view illustrating the configuration of part of the nonvolatile semiconductor memory device according to the embodiment.

More specifically, this figure illustrates part of the memory cell array unit MCU. For clarity of illustration, FIG. 5 shows three semiconductor pillars SP arranged along the X axis. However, in the embodiments, the number of semiconductor pillars SP arranged along the X axis is arbitrary.

As shown in FIG. 5, in the memory cell array unit MCU, for instance, the first electrode film 61 of the first stacked body ML1 penetrated by the first semiconductor pillar SP1 and the electrode film 61 of the fourth stacked body ML4 penetrated by the sixth semiconductor pillar SP6 are connected at one end on the X axis. The connected electrode films 61 serve as an electrode film 61A. The second electrode film 61b of the second stacked body ML2 penetrated by the second semiconductor pillar SP2 and the electrode film 61 of the third stacked body ML3 penetrated by the fifth semiconductor pillar SP5 are connected at the other end on the X axis. The connected electrode films 61 serve as an electrode film 61B. The first contact portion CU1 and the second contact portion CU2 are electrically connected to respective wirings.

A second dividing portion IL2 is provided. The second dividing portion IL2 electrically divides a plurality of third electrode films 61c and a plurality of fourth electrode films 61d from each other between the third stacked body ML3 and the fourth stacked body ML4. In this example, the second dividing portion IL2 is continuous to the first dividing portion IL1.

Figure 6:
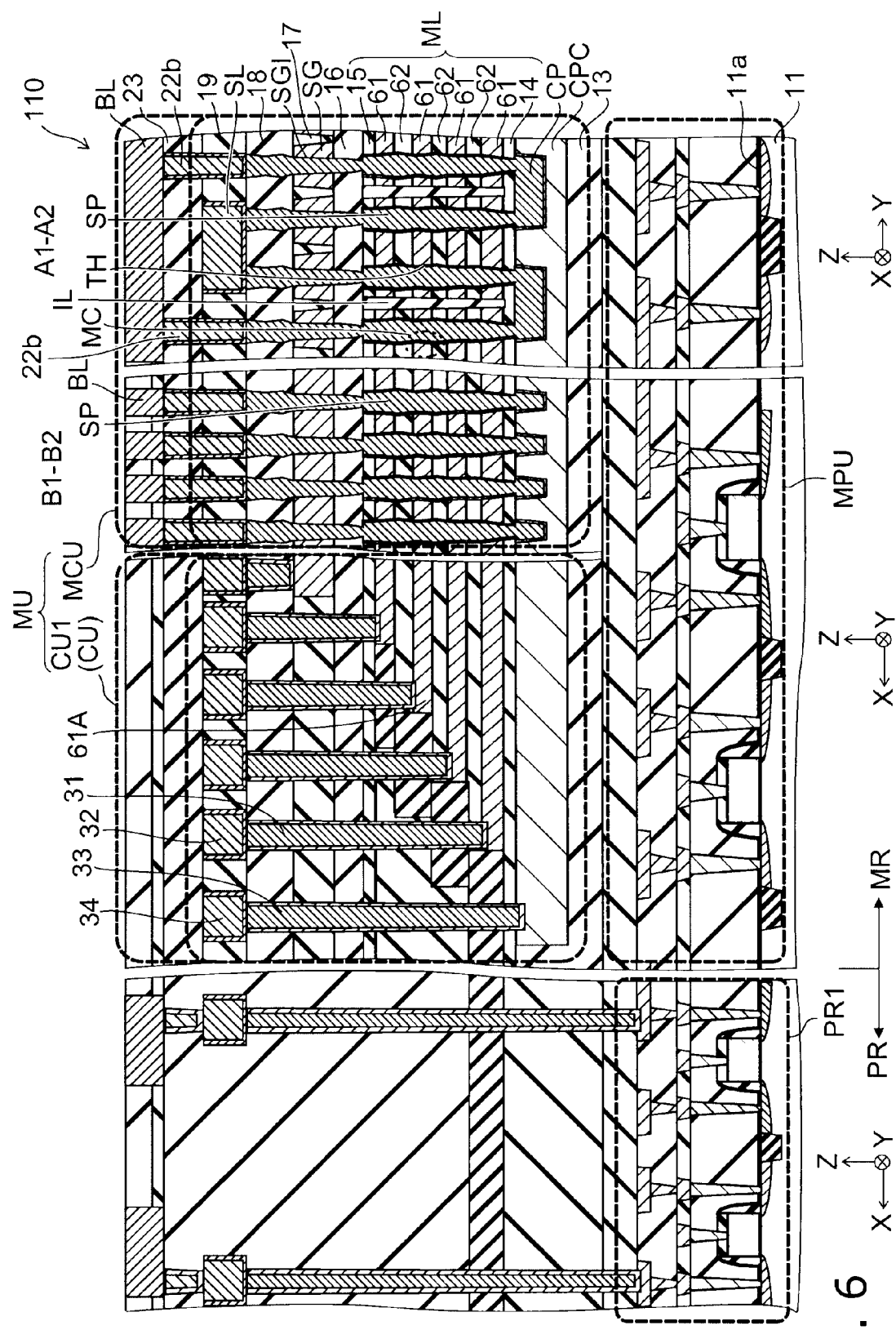
FIG. 6 is a schematic sectional view illustrating the configuration of the nonvolatile semiconductor memory device according to the first embodiment.

FIG. 6 is a schematic sectional view illustrating the configuration of the nonvolatile semiconductor memory device according to the first embodiment.

With regard to the memory cell array unit MCU, FIG. 6 illustrates a cross section corresponding to line A1-A2 of FIG. 1 and a cross section corresponding to line B1-B2 of FIG. 1.

As illustrated in FIG. 6, on the substrate 11, for instance, a memory region MR and a peripheral region PR are provided. The peripheral region PR is juxtaposed with the memory region MR on the major surface 11a. The peripheral region PR includes e.g. a peripheral circuit PR1 for operating the memory cells MC.

The memory region MR includes e.g. a memory unit MU and a memory unit peripheral circuit unit MPU. For instance, the memory unit peripheral circuit unit MPU is provided on the major surface 11a of the substrate 11.

The memory unit MU includes e.g. a memory cell array unit MCU and a contact portion CU (e.g., first contact portion CU1 and second contact portion CU2). The contact portion CU is juxtaposed with the memory cell array unit MCU in the X-Y plane.

As shown in FIG. 6, in this example, an interlayer insulating film 16 is provided between the select gate electrode SG and the interlayer insulating film 15.

An interlayer insulating film 17 is provided between select gate electrodes SG. A select gate insulating film SGI is provided between the select gate electrode SG and the semiconductor pillar SP. A select gate transistor SG is formed at the intersection between the plurality of select gate electrodes SG and the plurality of semiconductor pillars SP.

Here, in the semiconductor pillar SP, the portion penetrating through the stacked body ML and the portion penetrating through the select gate electrode SG may be formed collectively or in different process steps.

An interlayer insulating film 17 is provided between the source line SL and the select gate electrode SG. An interlayer insulating film 23 is provided between the source line SL and the bit line BL. The contact vias 22a and 22b penetrate through the interlayer insulating film 23 along the Z axis.

The select gate electrode SG is made of e.g. polysilicon. The select gate insulating film SGI is made of e.g. silicon oxide. The select gate insulating film SGI may be made of the material at least partly serving as the inner insulating film 42, the charge retention film 48, and the outer insulating film 43.

The interlayer insulating film 16, the interlayer insulating film 17, the interlayer insulating film 18, and the interlayer insulating film 23 can be made of e.g. silicon oxide.

The source line SL, the bit line BL, and the contact vias 22a and 22b are made of e.g. a metal material.

In the first contact portion CU1, the length along the X axis of the plurality of stacked electrode films 61 (e.g., the electrode films 61A penetrated by the first semiconductor pillar SP) is changed stepwise. A contact electrode 31 is connected to each of the electrode films 61A. The contact electrode 31 extends along the Z axis and connects each electrode film 61A to a word wiring 32.

The connecting portion conductive layer CPC is connected to e.g. a back gate wiring 34 by a contact electrode 33.

In the nonvolatile semiconductor memory device 110 according to the embodiment having the configuration described with reference to FIGS. 1 to 6, as described later, the dividing portion IL (first dividing portion IL1) illustrated in FIG. 2 is formed by forming a stacked film serving as the first memory film SIF1 in a slit ILt (first slit ILt1) when forming the first memory film SIF1 in the through hole TH. Like the through hole TH, the slit ILt is in contact with the connecting portion CP.

Thus, the forming of the dividing portion IL is performed simultaneously with the forming of at least part of the memory film SIF. This can reduce the number of manufacturing steps.

For instance, the stacked film included in the dividing portion IL includes a film including the material used for the first charge retention layer 48a. For instance, when the first memory film SIF1 is formed, the film serving as the first charge retention layer 48a can be formed in the slit ILt. Thus, at least part of the dividing portion IL is formed.

Furthermore, the stacked film included in the dividing portion IL can include a film including the material used for the first inner insulating film 42a. For instance, when the first memory film SIF1 is formed, the film serving as the first inner insulating film 42a can be formed in the slit ILt. Thus, at least part of the dividing portion IL is formed.

Moreover, the stacked film included in the dividing portion IL can include a film including the material used for the first outer insulating film 43a. For instance, when the first memory film SIF1 is formed, the film serving as the first outer insulating film 43a can be formed in the slit ILt. Thus, at least part of the dividing portion IL is formed.

For instance, the stacked film included in the dividing portion IL can include a silicon oxide film (e.g., the film used for the inner insulating film 42 and the outer insulating film 43) and a silicon nitride film (e.g., the film used for the charge retention film 48).

Thus, in this embodiment, the forming of the dividing portion IL is performed simultaneously with the forming of at least part of the memory film SIF. This can reduce the number of manufacturing steps.

Here, for instance, a reference example may be considered in which the dividing portion IL is in contact with the connecting portion CP but does not include a stacked film including the material used for the first memory film SIF1. In this reference example, the forming of the dividing portion IL is performed in a process different from the forming of the memory film SIF. As compared with this reference example, this embodiment can reduce the number of process steps.

In the nonvolatile semiconductor memory device 110, the thickness along the Y axis of the dividing portion IL is effectively constant. However, the embodiment is not limited thereto. The thickness along the Y axis of the dividing portion IL may be varied along e.g. the X axis.

Figure 7:
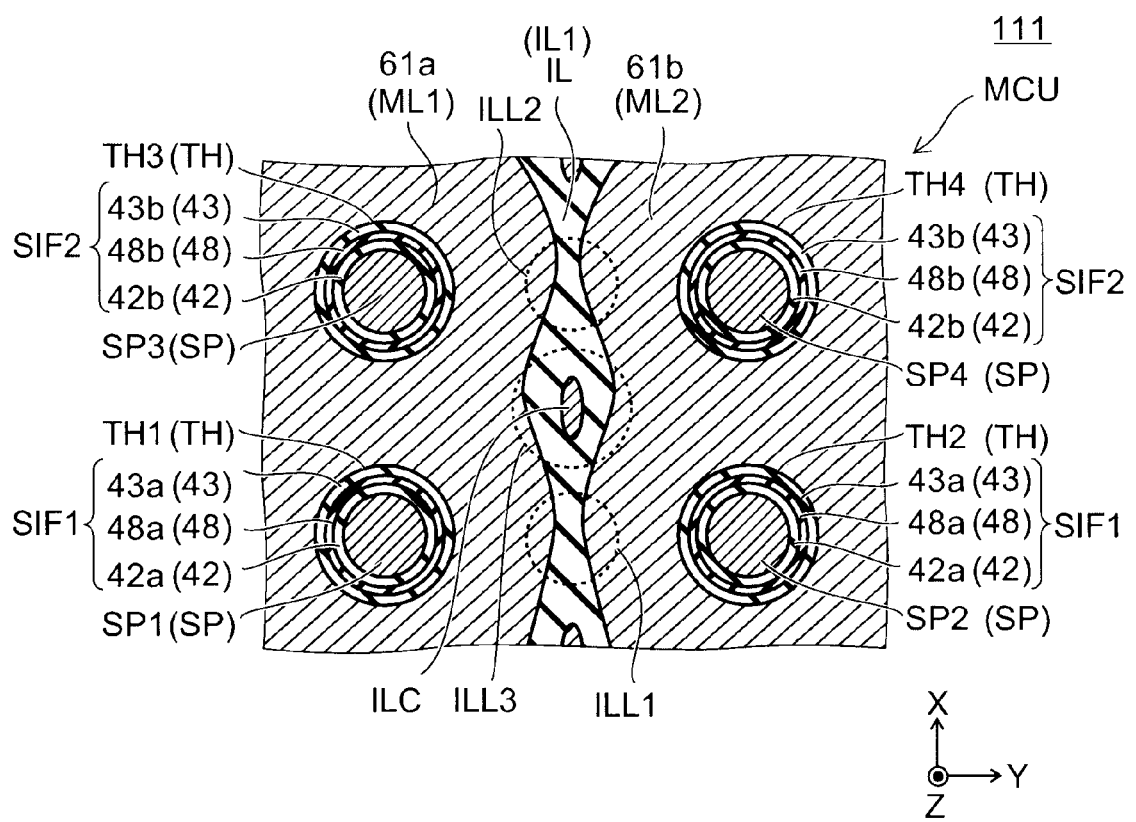
FIG. 7 is a schematic sectional view illustrating the configuration of part of an alternative nonvolatile semiconductor memory device according to the first embodiment.

FIG. 7 is a schematic sectional view illustrating the configuration of part of an alternative nonvolatile semiconductor memory device according to the first embodiment.

More specifically, FIG. 7 is a sectional view of the memory cell array unit MCU of the nonvolatile semiconductor memory device 111 according to the embodiment cut along the X-Y plane.

As shown in FIG. 7, in the nonvolatile semiconductor memory device 111, the cross section of the first dividing portion IL1 (dividing portion IL) has a curved shape. The rest of the configuration is similar to that of the nonvolatile semiconductor memory device 110, and hence the description thereof is omitted.

The first dividing portion IL1 includes a first portion ILL1, a second portion ILL2, and a third portion ILL3. The first portion ILL1 is a portion of the first dividing portion IL1 between the first semiconductor pillar SP1 and the second semiconductor pillar SP2. The second portion ILL2 is a portion of the first dividing portion IL1 between the third semiconductor pillar SP3 and the fourth semiconductor pillar SP4. The third portion ILL3 is a portion between the first portion ILL1 and the second portion ILL2. The third portion ILL3 is continuous to the first portion ILL1 along the X axis. The second portion ILL2 is continuous to the third portion ILL3 along the X axis.

The thickness along the Y axis of the third portion ILL3 is different from the thickness along the Y axis of the first portion ILL1. Furthermore, the thickness along the Y axis of the third portion ILL3 is different from the thickness along the Y axis of the second portion ILL2.

Specifically, the thickness along the Y axis of the third portion ILL3 is thicker than the thickness along the Y axis of the first portion ILL1, and thicker than the thickness along the Y axis of the second portion ILL2.

Thus, in the embodiment, the thickness along the Y axis of the dividing portion IL may be varied along e.g. the X axis.

The first to third portions ILL1-ILL3 having different widths are formed by e.g. interference of exposure light in the exposure step during the manufacturing process. Maintaining the dividing portion IL at a constant width places a tight constraint on the design condition and manufacturing condition. However, as in this example, permitting the formation of the third portion ILL3 with a wide width along the Y axis relaxes the constraint on the design condition and manufacturing condition. This can further increase the memory density, can further improve the electrical characteristics, and further facilitates manufacturing.

In this example, the third portion ILL3 includes a conductive portion ILC. This conductive portion ILC includes e.g. a layer including the material (semiconductor material) used for the semiconductor pillar SP. Because the third portion ILL3 is not aligned with the semiconductor pillar SP along the Y axis, there is no problem with the operation even if the third portion ILL3 includes the conductive portion ILC. Such a configuration relaxes the constraint on the design condition and manufacturing condition. This can further increase the memory density, can further improve the electrical characteristics, and further facilitates manufacturing.

Second Embodiment

The second embodiment relates to a method for manufacturing a nonvolatile semiconductor memory device.

This manufacturing method is a method for manufacturing the aforementioned nonvolatile semiconductor memory device. The nonvolatile semiconductor memory device includes a first stacked body ML1 including a plurality of first electrode films 61a and first interelectrode insulating films 62a, a first semiconductor pillar SP1, a second stacked body ML2 including a plurality of second electrode films 61b and second interelectrode insulating films 62b, a second semiconductor pillar SP2, a first connecting portion CP1 (connecting portion CP), a connecting portion conductive layer CPC, a first memory film SIF1, and a first dividing portion IL1 (dividing portion IL).

In the nonvolatile semiconductor memory device manufactured by this manufacturing method, the first dividing portion IL1 (dividing portion IL) includes a stacked film including the material used for the first memory film SIF1. That is, this manufacturing method is a method for manufacturing the nonvolatile semiconductor memory device 110 (or the nonvolatile semiconductor memory device 111) according to the first embodiment.

Figure 8:
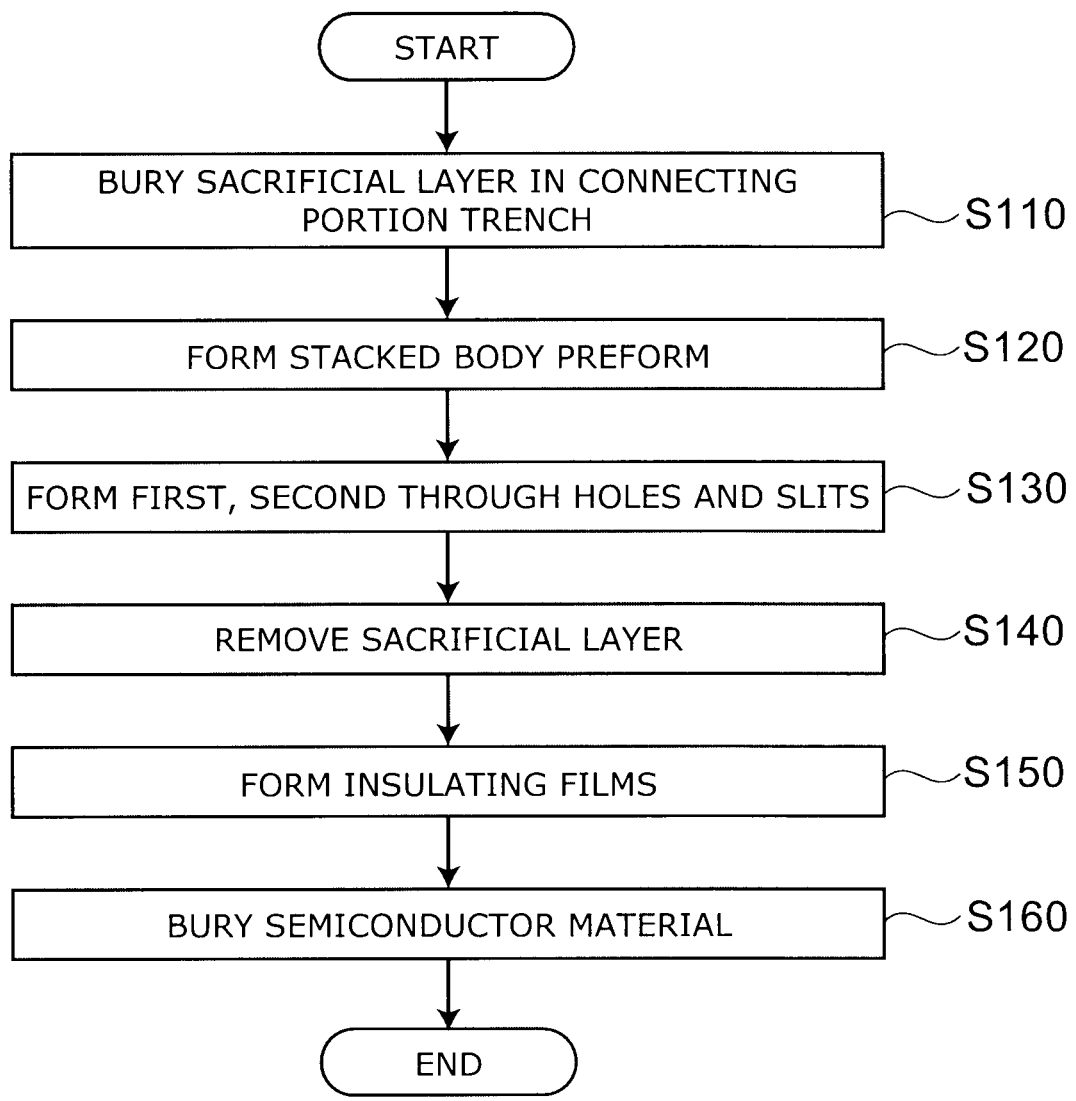
FIG. 8 is a flow chart illustrating a method for manufacturing a nonvolatile semiconductor memory device according to a second embodiment.

FIG. 8 is a flow chart illustrating a method for manufacturing a nonvolatile semiconductor memory device according to the second embodiment.

Figure 9A:
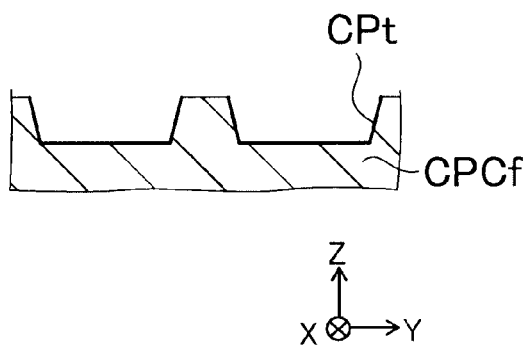
FIGS. 9A to 9C are sequential schematic sectional views illustrating the method for manufacturing a nonvolatile semiconductor memory device according to the second embodiment.
Figure 9B:
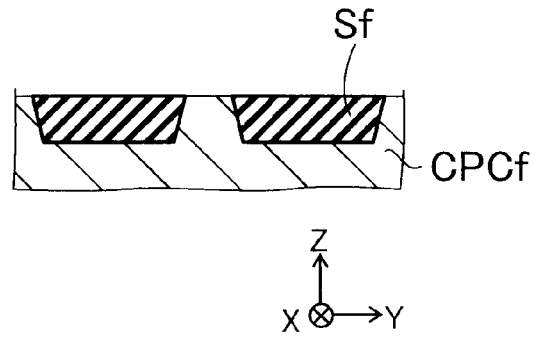
Figure 9C:
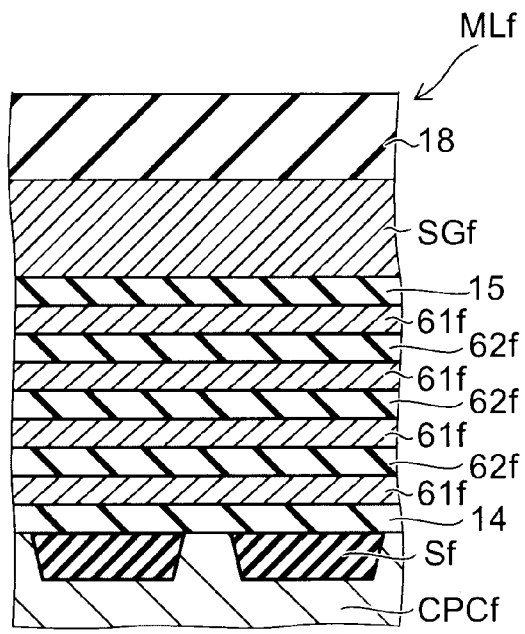

FIGS. 9A to 9C are sequential schematic sectional views illustrating the method for manufacturing a nonvolatile semiconductor memory device according to the second embodiment. FIGS. 9A to 9C are sectional views corresponding to the A1-A2 cross section of FIG. 1.

FIGS. 10A to 10D and 11A to 11D are sequential schematic views illustrating the method for manufacturing a nonvolatile semiconductor memory device according to the second embodiment. FIGS. 10B, 10D, 11B, and 11D are sectional views corresponding to the A1-A2 cross section of FIG. 1. FIGS. 10A, 10C, 11A, and 11C are plan views corresponding to the portion P1 of FIGS. 10B, 10D, 11B, and 11D, respectively.

As shown in FIG. 8, in this manufacturing method, a connecting portion trench CPt for forming a connecting portion CP therein is provided in a connecting portion conductive film CPCf serving as a connecting portion conductive layer CPC. A sacrificial layer Sf is buried in the connecting portion trench CPt (step S110).

For instance, a peripheral circuit PR1, a memory unit peripheral circuit unit MPU and the like are formed on the major surface 11a of a substrate 11. A polysilicon film is formed thereon as a connecting portion conductive film CPCf serving as a connecting portion conductive layer CPC.

Then, as shown in FIG. 9A, the connecting portion conductive film CPCf is patterned by photolithography to form a connecting portion trench CPt.

As shown in FIG. 9B, on the workpiece, a silicon nitride film serving as a sacrificial layer Sf is formed. Furthermore, the surface is etched to expose the surface of the connecting portion conductive film CPCf. Thus, the sacrificial layer Sf is buried in the connecting portion trench CPt.

As shown in FIG. 8, a stacked body preform MLf serving as a plurality of first stacked bodies ML1 and a plurality of second stacked bodies ML2 is formed on the sacrificial layer Sf (step S120).

More specifically, as shown in FIG. 9C, a silicon oxide film is formed as an interlayer insulating film 14. The thickness of the interlayer insulating film 14 is set so as to be able to ensure the breakdown voltage for the voltage applied to the lowermost electrode film 61.

On the interlayer insulating film 14, conductive films 61f serving as first electrode films 61a and second electrode films 61b, and insulating films 62f serving as first interelectrode insulating films 62a and second interelectrode insulating films 62b are alternately stacked. For instance, a polysilicon film is formed as the conductive film 61f. For instance, a silicon oxide film is formed as the insulating film 62f. In FIG. 9C, for clarity of illustration, four conductive films 61f and three insulating films 62f are depicted. However, the number of conductive films 61f and insulating films 62f is arbitrary.

Furthermore, a silicon oxide film is formed as an interlayer insulating film 15. Thus, a stacked body preform MLf is formed.

Furthermore, on the interlayer insulating film 15, a select gate electrode film SGf serving as a select gate electrode SG is formed. For instance, a polysilicon film is formed as the select gate electrode film SGf. Here, an interlayer insulating film 16 may be formed as necessary on the interlayer insulating film 15. On the select gate electrode film SGf, a silicon oxide film, for instance, is formed as an interlayer insulating film 18.

In this example, the stacked body preform MLf includes the select gate electrode film SGf and the interlayer insulating film 18 in addition to the interlayer insulating film 14, a plurality of conductive films 61f, a plurality of insulating films 62f, and the interlayer insulating film 15.

As shown in FIG. 8, a first through hole TH1, a second through hole TH2, and a first slit ILt1 (slit ILt) are formed (step S130). The first through hole TH1 penetrates through the stacked body preform MLf along the Z axis to the sacrificial layer Sf. The second through hole TH2 is juxtaposed with the first through hole TH1 along the Y axis and penetrates through the stacked body preform MLf along the Z axis to the sacrificial layer Sf. The first slit ILt1 penetrates through the stacked body preform MLf along the Z axis to the sacrificial layer Sf between the first through hole TH1 and the second through hole TH2 and divides the stacked body preform MLf.

Figure 10A:
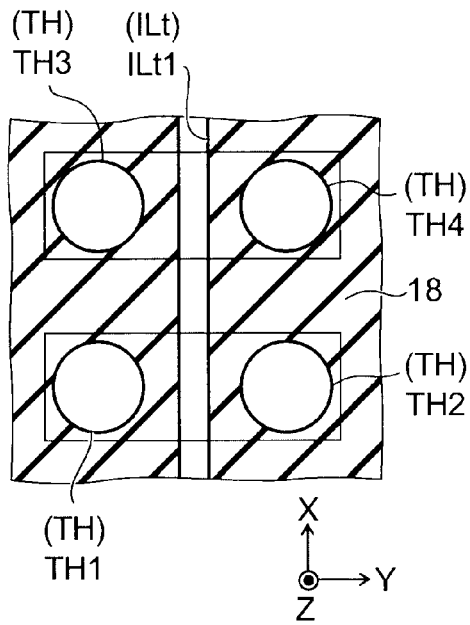
FIGS. 10A to 10D and 11A to 11D are sequential schematic views illustrating the method for manufacturing a nonvolatile semiconductor memory device according to the second embodiment.
Figure 10C:
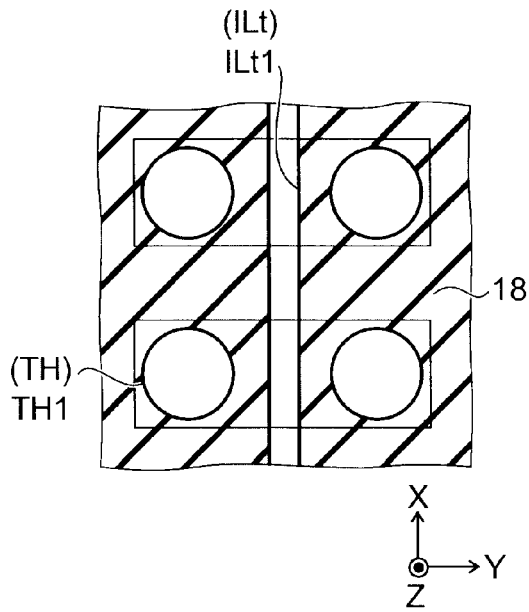
Figure 10B:
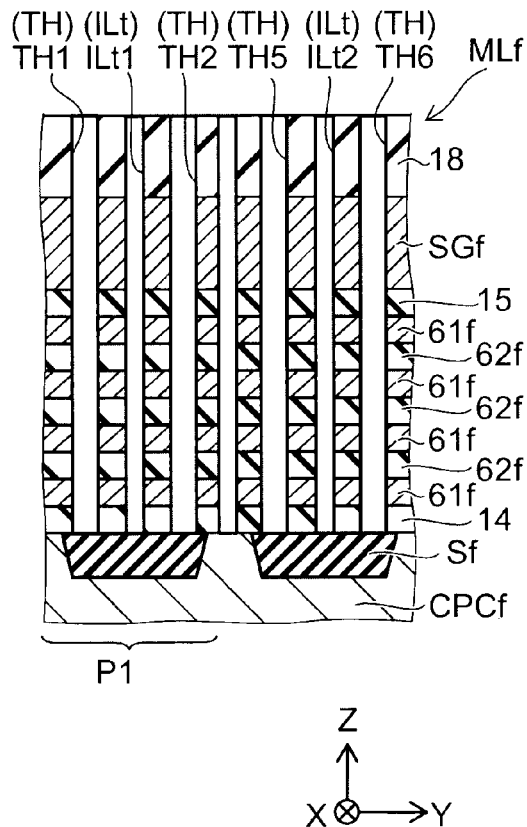

More specifically, as shown in FIGS. 10A and 10B, by lithography and etching, through holes TH (e.g., first to sixth through holes TH1-TH6) and slits ILt (e.g., first and second slits ILt1, ILt2) are simultaneously formed.

In this example, the slit ILt divides the stacked body preform MLf in a plane including the X and Z axes. That is, the side surface of the slit ILt is substantially planar. However, as described later, the side surface of the slit ILt may be a curved surface.

The diameter of the through hole TH is designed so that the through hole TH is not occluded by the memory film SIF (e.g., first and second memory films SIF1 and SIF2). The width of the slit ILt (e.g., the width along the Y axis) is designed so that the slit ILt is occluded by e.g. the memory film SIF.

For instance, the diameter along the Y axis of the first through hole TH1 and the diameter along the Y axis of the second through hole TH2 are designed to be larger than twice the thickness along the Y axis of the first memory film SIF1 (the stacked film formed later).

For instance, the width along the Y axis of the slit ILt is designed to be smaller than twice the thickness along the Y axis of the first memory film SIF1.

Figure 10D:
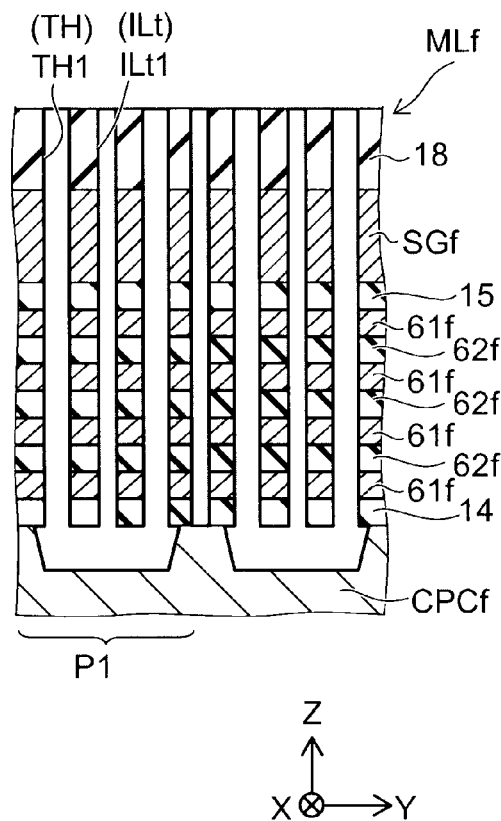

As shown in FIGS. 8, 10C, and 10D, the sacrificial layer Sf is removed through at least one of the first through hole TH1, the second through hole TH2, and the slit ILt to expose the inner wall surface of the connecting portion trench CPt (step S140). The sacrificial layer Sf (e.g., silicon nitride film) buried in the connecting portion trench CPt is removed by e.g. etching with chemicals.

As shown in FIG. 8, a stacked film is formed on each inner wall surface of the first through hole TH1, the second through hole TH2, and the connecting portion trench CPt to form a first memory film SIF1c. Simultaneously, at least part of the aforementioned stacked film is buried inside the slit ILt to form a dividing portion IL (step S150).

Figure 11A:
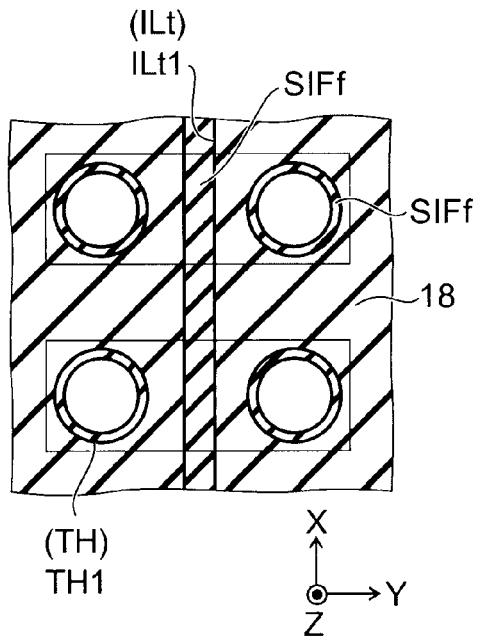
Figure 11C:
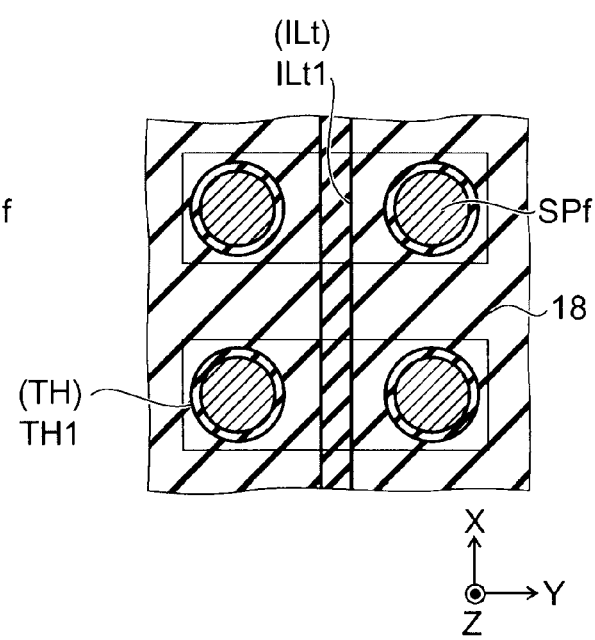
Figure 11B:
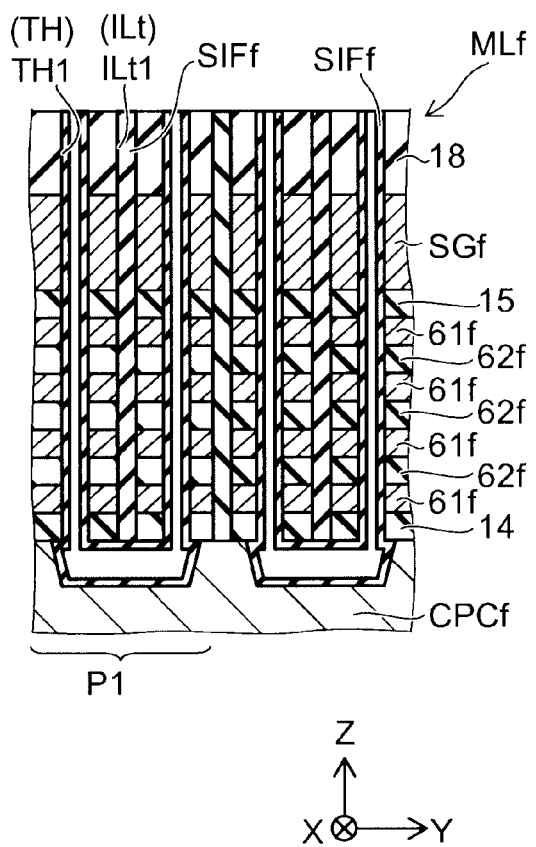

More specifically, as shown in FIGS. 11A and 11B, a stacked film SIFf is formed on each inner wall surface of the through holes TH and the connecting portion trench CPt. The stacked film SIFf includes a film serving as an outer insulating film 43, a film serving as a charge retention film 48, and a film serving as an inner insulating film 42.

As described above, the diameter of the through hole TH is designed to be larger than e.g. twice the thickness along the Y axis of the stacked film SIFf. Thus, the through hole TH is not occluded by the stacked film SIFf.

As described above, the width along the Y axis of the slit ILt is designed to be smaller than twice the thickness along the Y axis of the stacked film SIFf. Thus, the slit ILt is occluded by e.g. the memory film SIF. Accordingly, a dividing portion IL is formed. Here, the thickness along the Y axis of the dividing portion IL is smaller than twice the thickness along the Y axis of the first memory film SIF1.

Figure 11D:
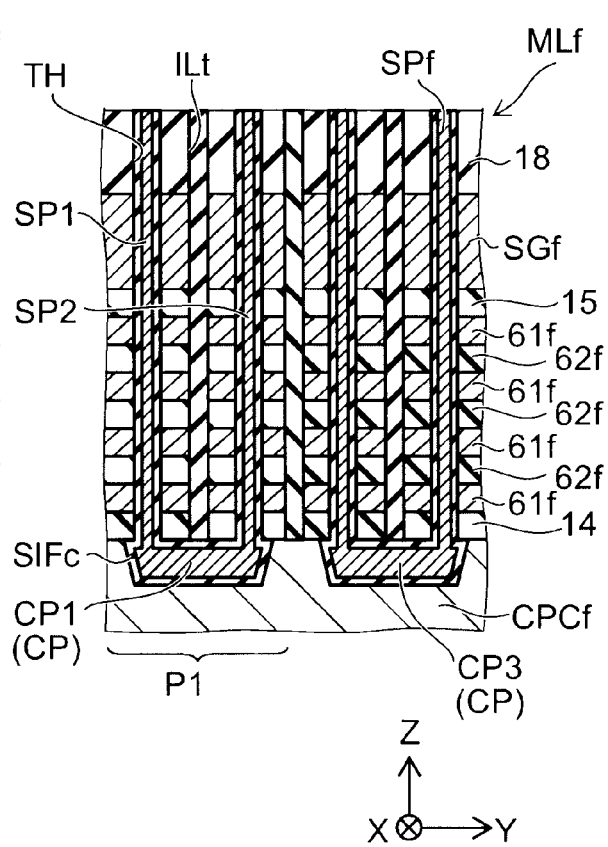

As shown in FIGS. 8, 11C, and 11D, a semiconductor material SPf is buried in the remaining space of the first through hole TH1, the second through hole TH2, and the connecting portion trench CPt to form a first semiconductor pillar SP1, a second semiconductor pillar SP2, and a connecting portion CP (step S160). As the semiconductor material SPf, polysilicon, for instance, is buried. Thus, the semiconductor pillars SP and connecting portions CP (first to third connecting portions CP1-CP3) are formed.

Here, the width of the slit ILt is appropriately designed so that the slit ILt is occluded by the stacked film SIFf. Thus, the semiconductor material SPf does not enter the slit ILt. That is, no conductive portion is formed in the slit ILt. Thus, the semiconductor pillars SP are not electrically connected to each other by the slit ILt.

Subsequently, various contact electrodes, various wirings, and various interlayer insulating films are formed. Thus, the nonvolatile semiconductor memory device 110 is formed.

In the manufacturing method according to this embodiment, the through holes TH and slits ILt are collectively formed. Furthermore, the forming of the dividing portion IL is performed by the forming of the memory film SIF. Thus, as compared with the case of independently performing these process steps, the number of manufacturing steps can be reduced. According to this embodiment, the manufacturing cost can be reduced.

FIGS. 12A to 12D and 13A to 13D are sequential schematic views illustrating an alternative method for manufacturing a nonvolatile semiconductor memory device according to the second embodiment.

These figures illustrate part of the method for manufacturing the nonvolatile semiconductor memory device 111 illustrated in FIG. 7. FIGS. 12B, 12D, 13B, and 13D are sectional views corresponding to the A1-A2 cross section of FIG. 1. FIGS. 12A, 12C, 13A, and 13C are plan views corresponding to the portion P1 of FIGS. 12B, 12D, 13B, and 13D, respectively.

The process for manufacturing the nonvolatile semiconductor memory device 111 can use the method described with reference to FIGS. 9A to 9C, and hence the description of this part is omitted.

Figure 12A:
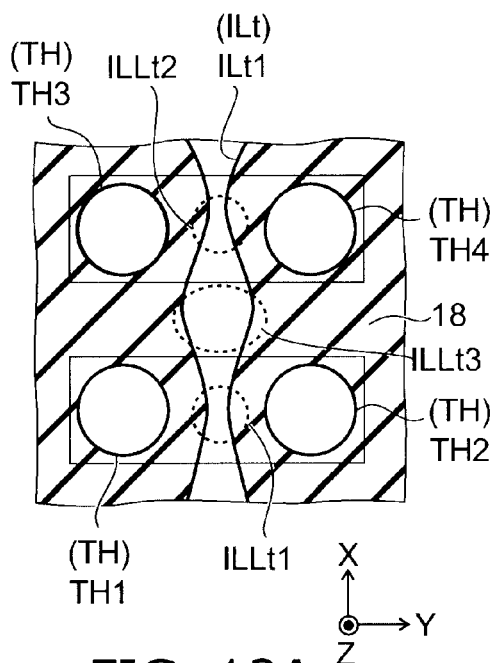
FIGS. 12A to 12D and 13A to 13D are sequential schematic views illustrating an alternative method for manufacturing a nonvolatile semiconductor memory device according to the second embodiment.
Figure 12C:
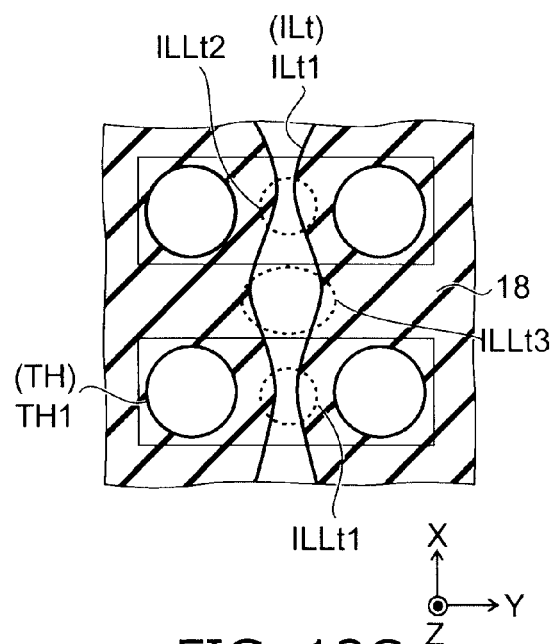
Figure 12B:
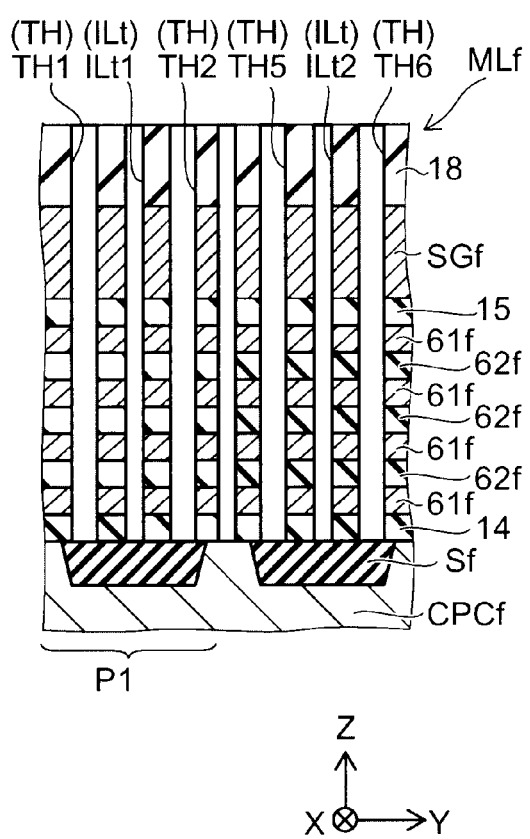

As shown in FIGS. 12A and 12B, by lithography and etching, through holes TH (e.g., first to sixth through holes TH1-TH6) and slits ILt (e.g., first and second slits ILt1, ILt2) are simultaneously formed. The through holes TH and the slits ILt reach the sacrificial layer Sf (step S130).

Here, as shown in FIG. 12A, the slit ILt (first slit ILt1) includes a first slit portion ILLt1, a second slit portion ILLt2, and a third slit portion ILLt3. The first slit portion ILLt1 is a portion of the first slit ILt1 between the first semiconductor pillar SP1 and the second semiconductor pillar SP2. The second slit portion ILLt2 is a portion of the first slit ILt1 between the third semiconductor pillar SP3 and the fourth semiconductor pillar SP4. The third slit portion ILLt3 is a portion between the first slit portion ILLt1 and the second slit portion ILLt2.

The width along the Y axis of the third slit portion ILLt3 is different from the width along the Y axis of the first slit portion ILLt1. Furthermore, the width along the Y axis of the third slit portion ILLt3 is different from the width along the Y axis of the second slit portion ILLt2.

Specifically, the width along the Y axis of the third slit portion ILLt3 is wider than the width along the Y axis of the first slit portion ILLt1, and wider than the width along the Y axis of the second slit portion ILLt2. The width along the Y axis of the slit ILt is continuously varied along the X axis. That is, the side surface of the slit ILt is a curved surface.

The width along the Y axis of the first slit portion ILLt1 and the width along the Y axis of the second slit portion ILLt2 of the first slit ILt (slit ILt) are designed to be smaller than twice the thickness along the Y axis of the first memory film SIF1.

Here, in this example, the width along the Y axis of the third slit portion ILLt3 is larger than twice the thickness along the Y axis of the first memory film SIF1.

Figure 12D:
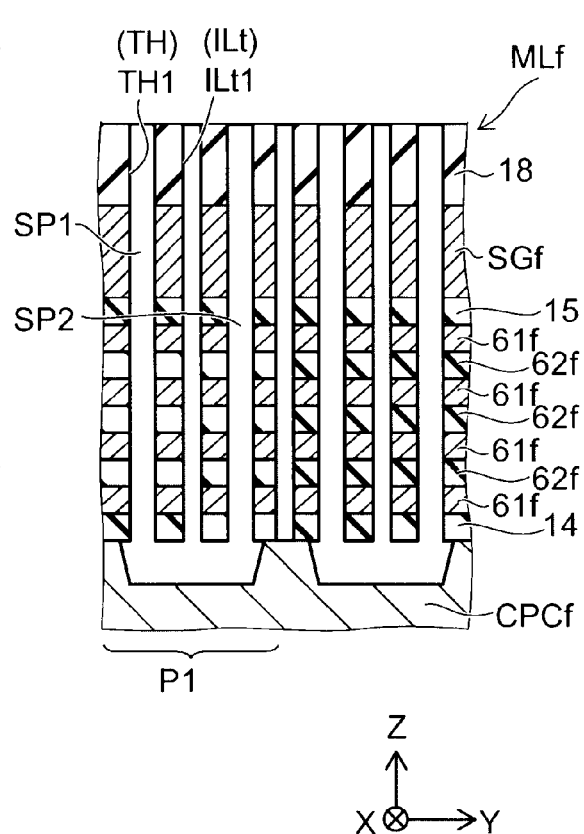

As shown in FIGS. 12C and 12D, the sacrificial layer Sf (e.g., silicon nitride film) buried in the connecting portion trench CPt is removed through at least one of the through holes TH and the slits ILt by etching with chemicals (step S140).

Figure 13A:
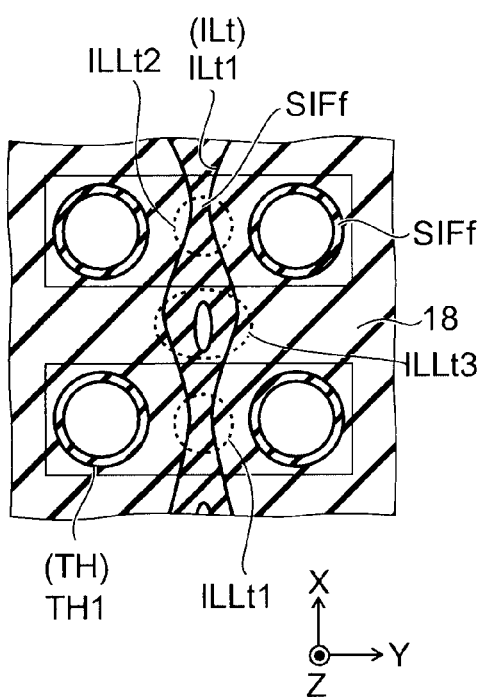
Figure 13C:
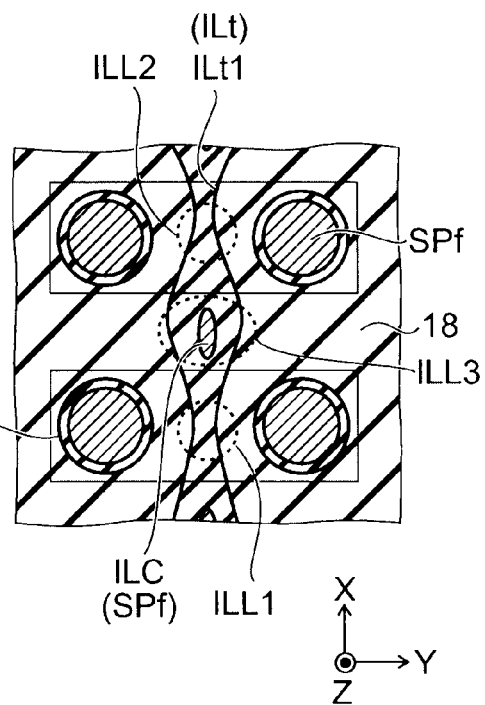
Figure 13B:
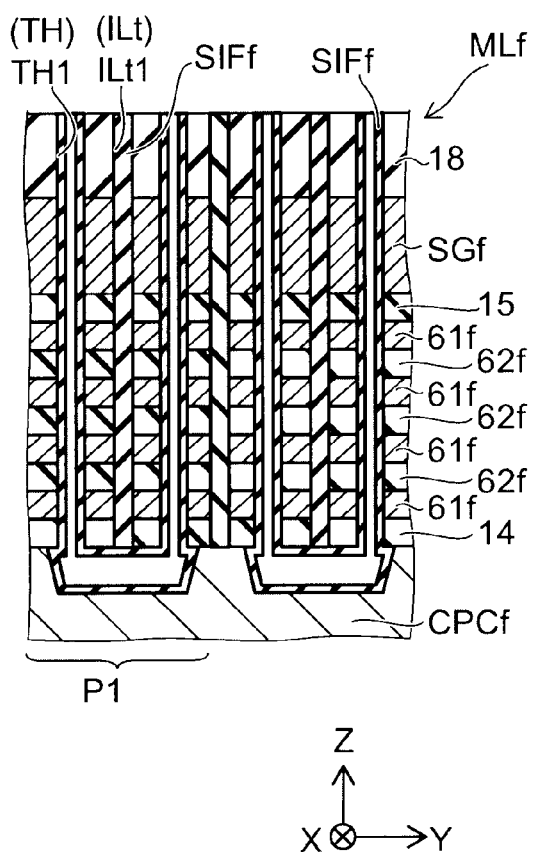

As shown in FIGS. 13A and 13B, a stacked film SIFf is formed on each inner wall surface of the through holes TH and the connecting portion trench CPt (step S150). The stacked film SIFf includes a film serving as an outer insulating film 43, a film serving as a charge retention film 48, and a film serving as an inner insulating film 42.

The width along the Y axis of the first slit portion ILLt1 and the width along the Y axis of the second slit portion ILLt2 are designed to be smaller than twice the thickness along the Y axis of the stacked film SIFf. Thus, the first slit portion ILLt1 and the second slit portion ILLt2 are occluded by e.g. the memory film SIF. Accordingly, a dividing portion IL is formed.

On the other hand, the width along the Y axis of the third slit portion ILLt3 is larger than twice the thickness along the Y axis of the first memory film SIF1. Thus, a space remains in the third slit portion ILLt3.

Figure 13D:
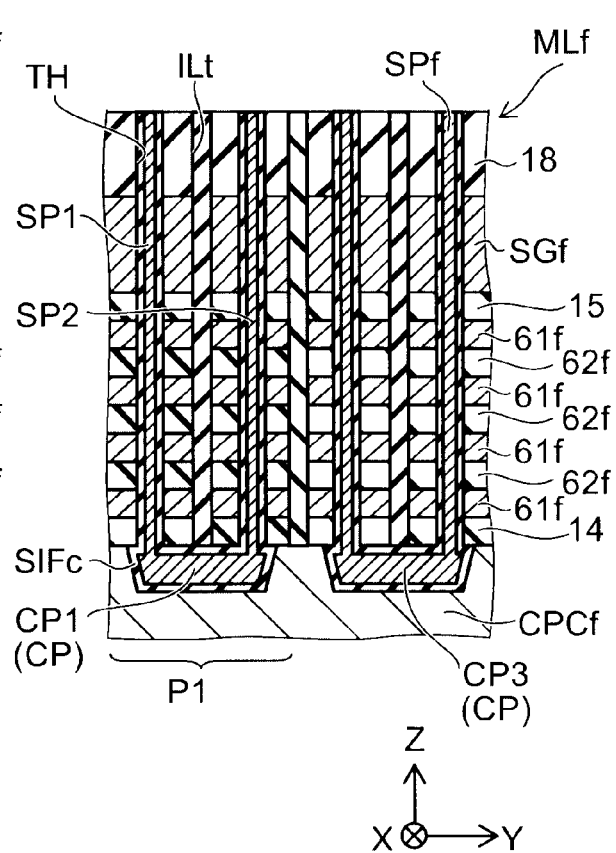

As shown in FIGS. 13C and 13D, a semiconductor material SPf (e.g., polysilicon) serving as a channel is buried in the remaining space of the first through hole TH1, the second through hole TH2, and the connecting portion trench CPt (step S160). Thus, semiconductor pillars SP and connecting portions CP (first to third connecting portions CP1-CP3) are formed.

At this time, the above semiconductor material SPf is buried in the space remaining in the third slit portion ILLt3. Thus, a conductive portion ILC is formed in the third slit portion ILLt3 (third portion ILL3).

Subsequently, various contact electrodes, various wirings, and various interlayer insulating films are formed. Thus, the nonvolatile semiconductor memory device 111 is formed.

This manufacturing method can also reduce the number of manufacturing steps. Furthermore, in this manufacturing method, the width of the slit ILt is not made constant.

Third Embodiment

The third embodiment relates to a method for manufacturing a nonvolatile semiconductor memory device.

The nonvolatile semiconductor memory device manufactured by this manufacturing method has the same configuration as the nonvolatile semiconductor memory device 110 or 111 except that, for instance, the dividing portion IL may be a monolayer film. Hence, the description thereof is omitted.

In the nonvolatile semiconductor memory device manufactured by this manufacturing method, the first dividing portion IL1 (dividing portion IL) may not include a stacked film including the material used for the first memory film SIF1.

Figure 14:
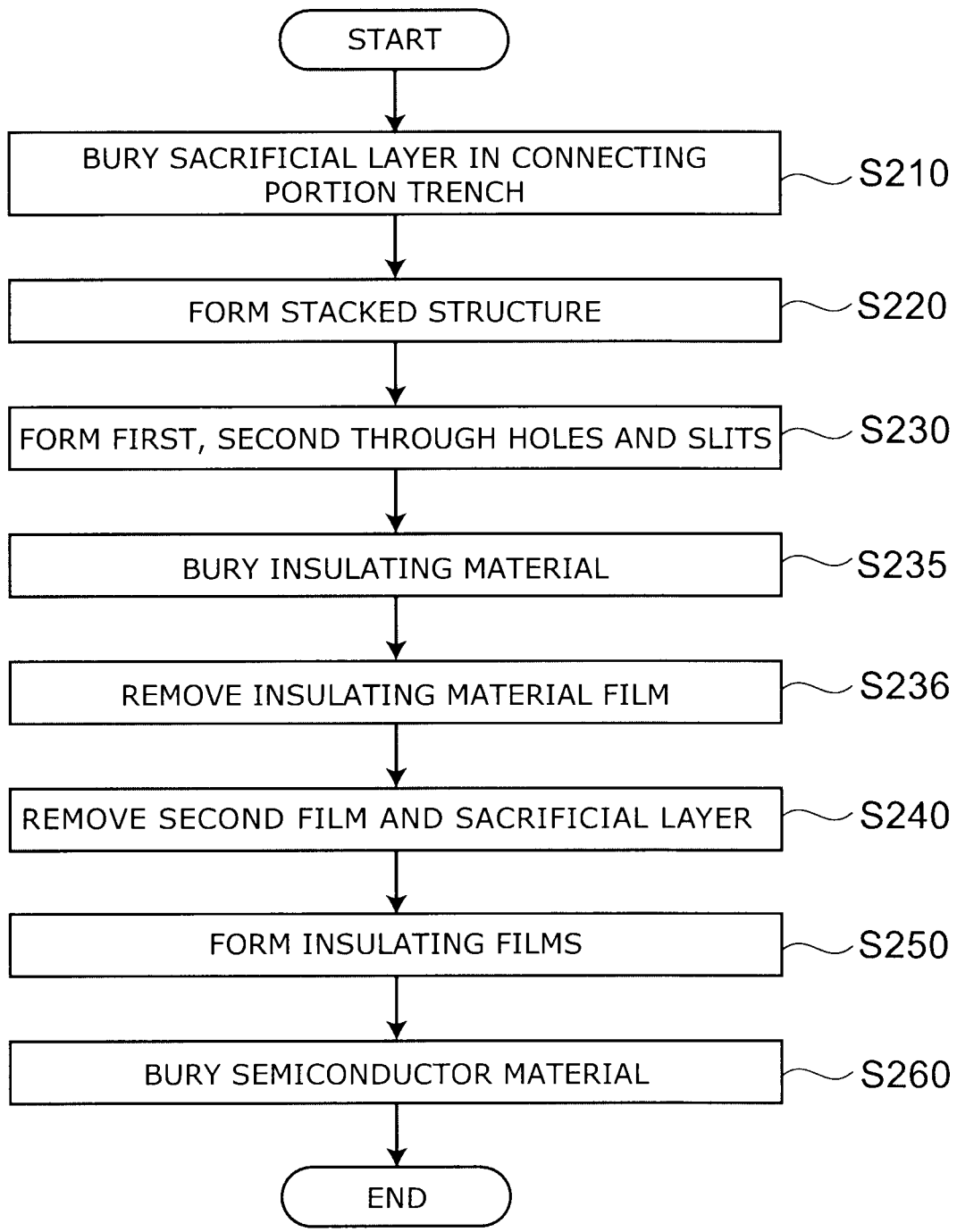
FIG. 14 is a flow chart illustrating a method for manufacturing a nonvolatile semiconductor memory device according to a third embodiment.

FIG. 14 is a flow chart illustrating a method for manufacturing a nonvolatile semiconductor memory device according to the third embodiment.

Figure 15A:
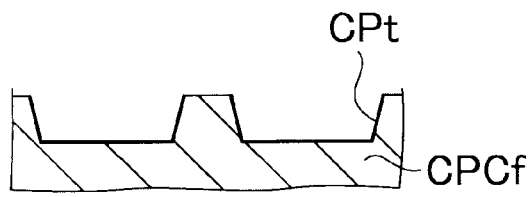
FIGS. 15A to 15C are sequential schematic sectional views illustrating the method for manufacturing a nonvolatile semiconductor memory device according to the third embodiment.
Figure 15B:
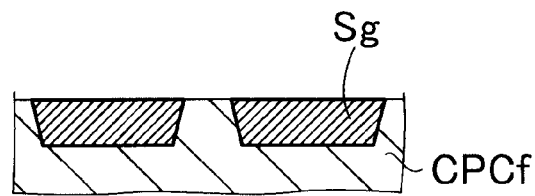
Figure 15C:
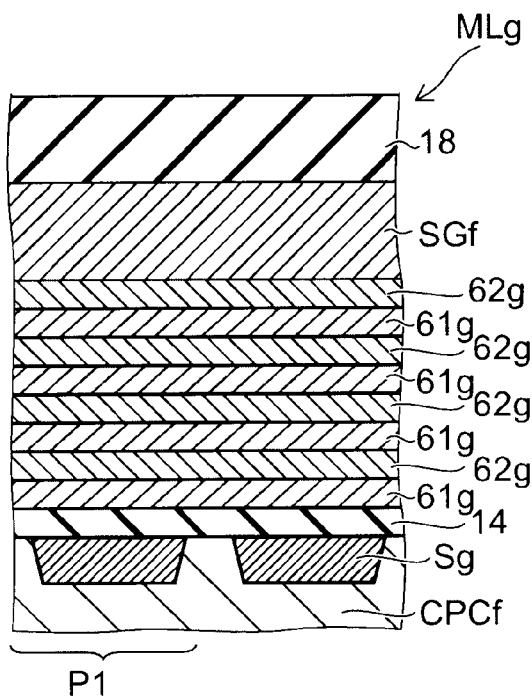

FIGS. 15A to 15C are sequential schematic sectional views illustrating the method for manufacturing a nonvolatile semiconductor memory device according to the third embodiment. FIGS. 15A to 15C are sectional views corresponding to the A1-A2 cross section of FIG. 1.

FIGS. 16A to 16D, 17A to 17D, and 18A and 18B are sequential schematic views illustrating the method for manufacturing a nonvolatile semiconductor memory device according to the third embodiment. FIGS. 16B, 16D, 17B, 17D, and 18B are sectional views corresponding to the A1-A2 cross section of FIG. 1. FIGS. 16A, 16C, 17A, 17C, and 18A are plan views corresponding to the portion P1 of FIGS. 16B, 16D, 17B, 17D, and 18B, respectively.

As shown in FIG. 14, in this manufacturing method, a connecting portion trench CPt for forming a connecting portion CP therein is provided in a connecting portion conductive film CPCf serving as a connecting portion conductive layer CPC. A sacrificial layer is buried in the connecting portion trench CPt (step S210).

For instance, on the major surface 11a of a substrate 11, a polysilicon film is formed as a connecting portion conductive film CPCf serving as a connecting portion conductive layer CPC.

Then, as shown in FIG. 15A, the connecting portion conductive film CPCf is patterned by photolithography to form a connecting portion trench CPt.

As shown in FIG. 15B, a sacrificial layer Sg is formed. In this example, a non-doped (low impurity concentration) polysilicon film is used as the sacrificial layer Sg. Subsequently, the surface of the non-doped polysilicon film is etched. Thus, the sacrificial layer Sg is buried in the connecting portion trench CPt.

As shown in FIG. 14, on the sacrificial layer Sg, first films and second films having a higher etching rate than the first films are alternately formed to form a stacked structure (step S220).

More specifically, as shown in FIG. 15C, a silicon oxide film is formed as an interlayer insulating film 14.

On the interlayer insulating film 14, first films 61g and second films 62g are alternately stacked. For instance, as the first film 61g, a polysilicon film doped with impurity is formed. This impurity can be e.g. boron. As the second film 62g, a non-doped (low impurity concentration) polysilicon film is formed. Thus, a stacked structure MLg is formed.

In FIG. 15C, for clarity of illustration, four first films 61g and four second films 62g are depicted. However, the number of first films 61g and second films 62g is arbitrary. Here, in this example, the interlayer insulating film 15 (e.g., silicon oxide film) is omitted.

Furthermore, on the plurality of first films 61g and the plurality of second films 62g, a select gate electrode film SGf serving as a select gate electrode SG is formed. For instance, a polysilicon film is formed as the select gate electrode film SGf. For instance, this polysilicon film is doped with impurity. Here, as necessary, the interlayer insulating film 15 may be provided and an interlayer insulating film 16 may be formed on the interlayer insulating film 15. On the select gate electrode film SGf, a silicon oxide film, for instance, is formed as an interlayer insulating film 18.

In this example, the stacked structure MLg includes the select gate electrode film SGf and the interlayer insulating film 18 in addition to the interlayer insulating film 14, the plurality of first films 61g, and the plurality of second films 62g.

As shown in FIG. 14, a first through hole TH1, a second through hole TH2, and a first slit ILt1 (slit ILt) are formed (step S230). The first through hole TH1 penetrates through the stacked structure MLg along the Z axis to the sacrificial layer Sg. The second through hole TH2 is juxtaposed with the first through hole TH1 along the Y axis and penetrates through the stacked structure MLg along the Z axis to the sacrificial layer Sg. The first slit ILt1 penetrates through the stacked structure MLg along the Z axis to the sacrificial layer Sg between the first through hole TH1 and the second through hole TH2 and divides the stacked structure MLg.

Figure 16A:
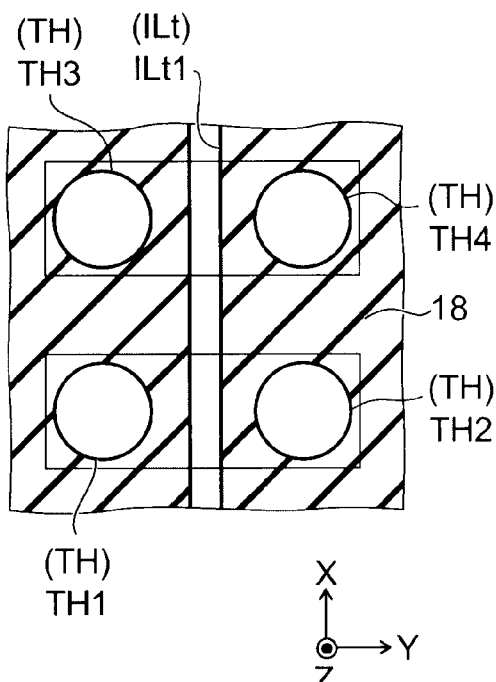
FIGS. 16A to 16D, 17A to 17D, and 18A and 18B are sequential schematic views illustrating the method for manufacturing a nonvolatile semiconductor memory device according to the third embodiment.
Figure 16C:
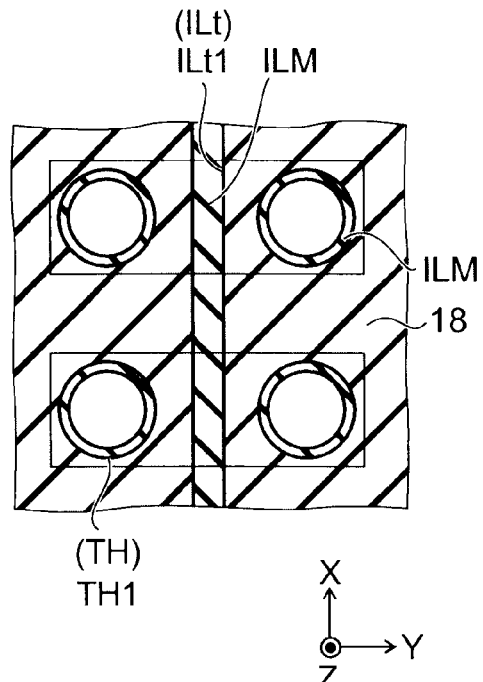
Figure 16B:
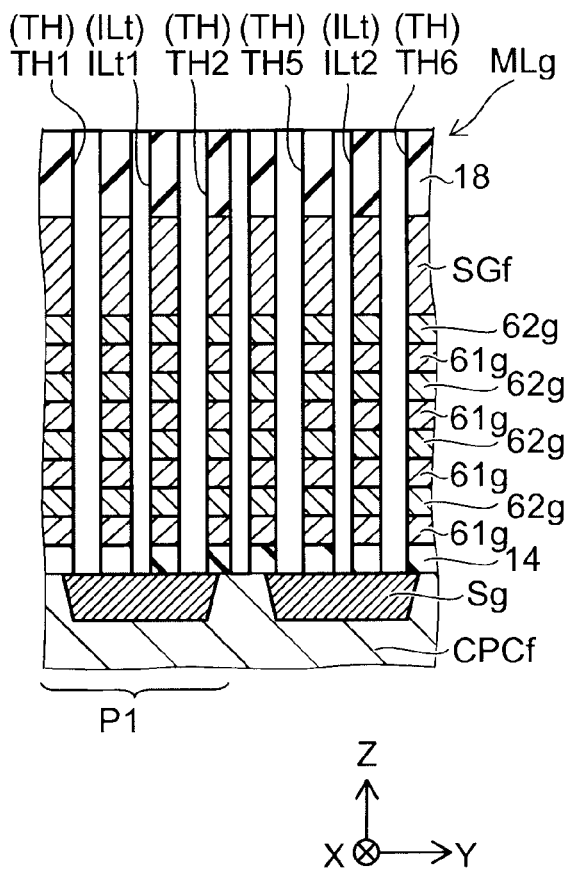

More specifically, as shown in FIGS. 16A and 16B, by lithography and etching, through holes TH (e.g., first to sixth through holes TH1-TH6) and slits ILt (e.g., first and second slits ILt1, ILt2) are simultaneously formed. The through holes TH and the slits ILt reach the sacrificial layer Sg.

In this example, the slit ILt divides the stacked structure MLg in a plane including the X and Z axes. That is, the side surface of the slit ILt is substantially planar. In the case of manufacturing a nonvolatile semiconductor memory device in which the side surface of the dividing portion IL is shaped like a curved surface as in the nonvolatile semiconductor memory device 111, the side surface of the slit ILt may be a curved surface.

As shown in FIG. 14, an insulating material is buried inside the first slit ILt1 (slit ILt) to form a first dividing portion IL1 (dividing portion IL) (step S235).

Figure 16D:
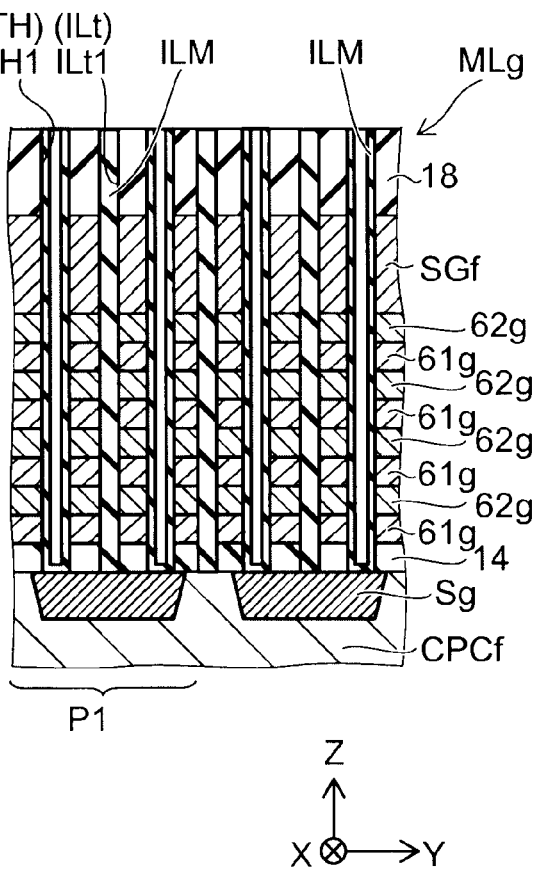

More specifically, as shown in FIGS. 16C and 16D, an insulating material film ILM is buried inside the slits ILt (e.g., first slit ILt1 and second slit ILt2). Simultaneously, the insulating material film ILM is formed on the inner wall surface of the through holes TH (e.g., first to sixth through holes TH1-TH6). For this insulating material, for instance, a silicon oxide film is used.

The diameter along the axis (e.g., Y axis) perpendicular to the Z axis of the first through hole TH1 and the diameter along the axis (e.g., Y axis) perpendicular to the Z axis of the second through hole TH2 formed in step S230 are designed to be larger than twice the thickness along the axis (e.g., Y axis) perpendicular to the Z axis of the insulating material film ILM formed in step S235.

For instance, the width along the Y axis of the slit ILt is designed to be smaller than twice the thickness along the Y axis of the insulating material film ILM.

Thus, the through hole TH is not occluded by the insulating material film ILM, but a space remains inside. However, the slit ILt is occluded by the insulating material film ILM.

As shown in FIG. 14, the insulating material film ILM formed on the inner wall surface of the first through hole TH1 and the insulating material film ILM formed on the inner wall surface of the second through hole TH2 are removed (step S236).

Figure 17A:
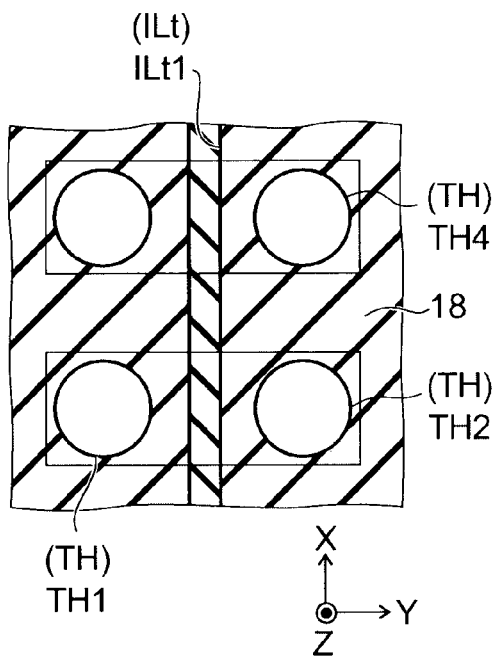
Figure 17C:
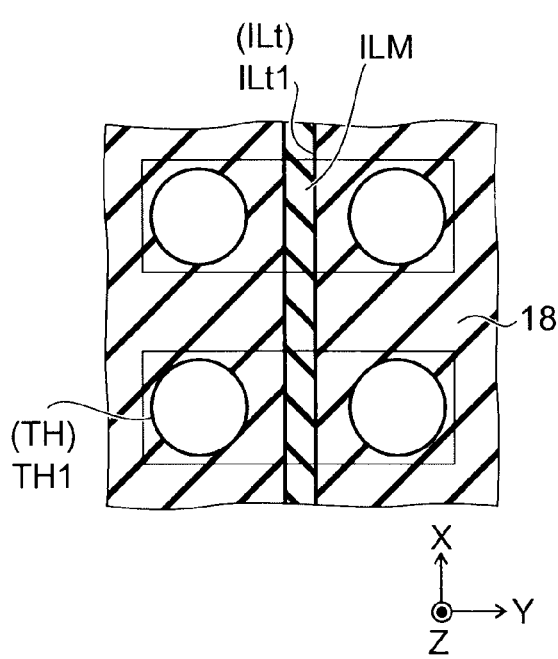
Figure 17B:
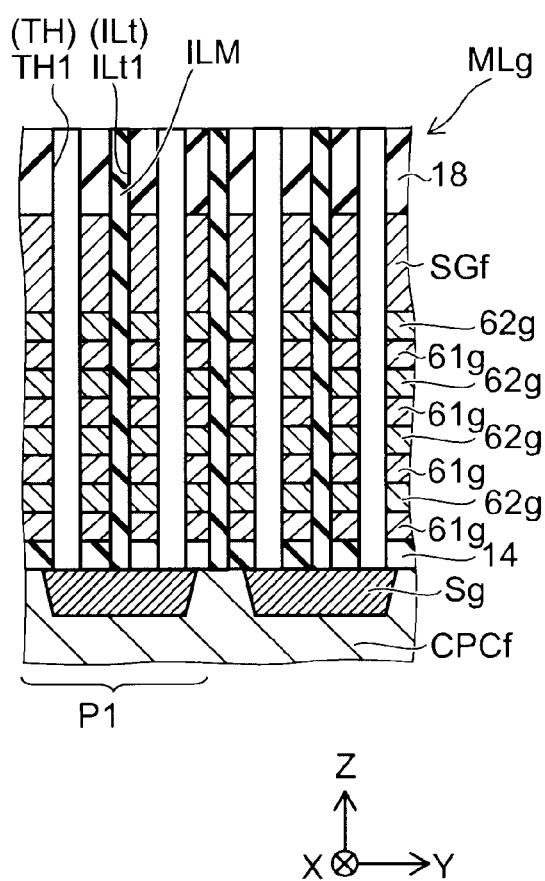

More specifically, as shown in FIGS. 17A and 17B, the insulating material film ILM formed on the inner wall surface of the through hole TH is removed. At this time, no space has remained inside the slit ILt. Hence, the insulating material film ILM formed inside the slit ILt is not substantially removed. Here, in an upper portion of the slit ILt, the insulating material film ILM may be slightly removed.

As shown in FIG. 14, through the first through hole TH1 and the second through hole TH2, the second films 62g and the sacrificial layer Sg are removed while leaving the first films 61g (step S240).

Figure 17D:
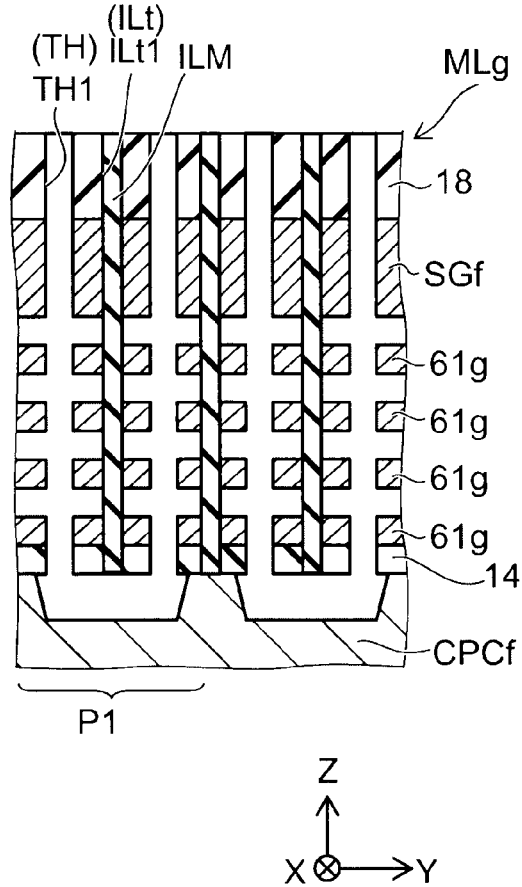

More specifically, as shown in FIGS. 17C and 17D, the insulating material film ILM formed on the inner wall surface of the through hole TH is removed through the remaining space of the through hole TH. Then, the sacrificial layer Sg is removed. Thus, the inner wall surface of the connecting portion trench CPt is exposed.

For the above removal of the second films 62g and the sacrificial layer Sg, for instance, etching with chemicals is used.

The removal of the insulating material film ILM (step S236) and the removal of the second films 62g and the sacrificial layer Sg (step S240) may be performed continuously, or discontinuously as separate process steps. Alternatively, step S236 may be performed as part of step S240. That is, step S236 is performed as necessary, and may be omitted as the case may be.

As shown in FIG. 14, a stacked film is formed on each inner wall surface of the first through hole TH1, the second through hole TH2, and the connecting portion trench CPt. Thus, a first memory film SIF1, a second memory film SIF2, and a connecting portion insulating film SIFc are formed. Simultaneously, at least part of the stacked film is buried in the space formed by the removal of the second films 62g. Thus, first interelectrode insulating films 62a and second interelectrode insulating films 62b are formed (step S250).

Figure 18A:
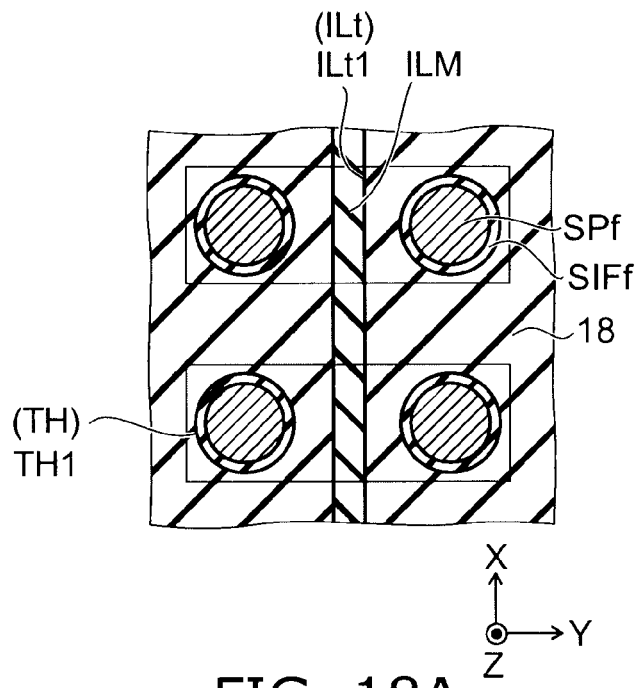
Figure 18B:
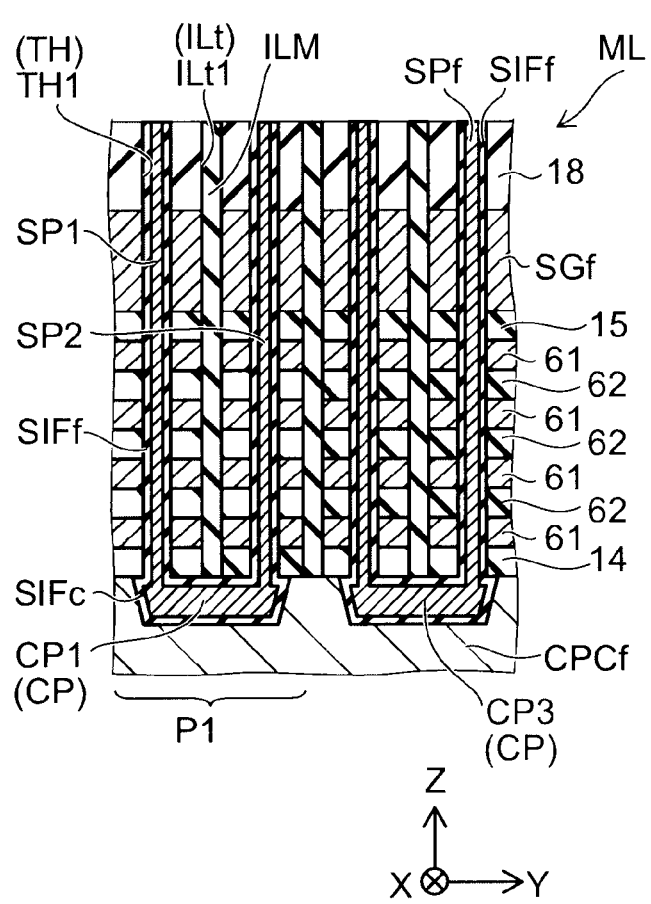

More specifically, as shown in FIGS. 18A and 18B, a stacked film SIFf is formed on each inner wall surface of the through holes TH and the connecting portion trench CPt. Thus, a first memory film SIF1 is formed. Simultaneously, at least part of the stacked film SIFf is buried in the space formed by the removal of the second films 62g. Thus, interelectrode insulating films 62 are formed. Furthermore, for instance, the stacked film SIFf buried in the space formed by the removal of the uppermost second film 62g serves as an interlayer insulating film 15. The first film 61g serves as an electrode film 61.

As shown in FIG. 14, a semiconductor material SPf is buried in the remaining space of the first through hole TH1, the second through hole TH2, and the connecting portion trench CPt to form a first semiconductor pillar SP1, a second semiconductor pillar SP2, and a connecting portion CP (step S260).

More specifically, as shown in FIGS. 18A and 18B, the semiconductor material SPf is buried in the through holes TH (e.g., first to sixth through holes TH1-TH6) and the connecting portion trench CPt. Thus, semiconductor pillars SP (e.g., first to sixth semiconductor pillars SP1-SP6) and connecting portions CP (e.g., first to third connecting portions CP1-CP3) are formed.

Subsequently, various contact electrodes, various wirings, and various interlayer insulating films are formed. Thus, the nonvolatile semiconductor memory device is formed.

Furthermore, in the forming of the slit ILt illustrated in FIGS. 16A and 16B, the side surface of the slit ILt can be shaped like a curved surface. Thus, it is possible to form a nonvolatile semiconductor memory device in which the side surface of the dividing portion IL is shaped like a curved surface.

In the manufacturing method according to this embodiment, the through holes TH and slits ILt are collectively formed. Furthermore, the forming of the interelectrode insulating films 62 is performed by the forming of the stacked film SIFf serving as the memory film SIF. Thus, as compared with the case of independently performing these process steps, the number of manufacturing steps can be reduced. According to this embodiment, the manufacturing cost can be reduced.

In this manufacturing method, the thickness along the Z axis of the second film 62g is designed to be twice or less the thickness along the axis (e.g., Y axis) perpendicular to the Z axis of the memory film SIF (e.g., first and second memory films SIF1 and SIF2).

That is, in the case where the nonvolatile semiconductor memory device is manufactured by the manufacturing method according to the third embodiment, the thickness along the Z axis of the interelectrode insulating film 62 is designed to be twice or less the thickness along the axis perpendicular to the Z axis of the memory film SIF.

In this manufacturing method, for instance, the first film 61g is conductive. The specific resistance of the second film 62g is higher than the specific resistance of the first film 61g.

For instance, the first film 61g is a non-crystalline silicon film doped with impurity. The second film 62g is a non-crystalline silicon film having a lower impurity concentration than the first film 61g.

For instance, the first film 61g is an amorphous silicon film doped with impurity, or a polysilicon film doped with impurity. The second film 62g is an amorphous silicon film having a lower impurity concentration than the first film 61g, or a polysilicon film having a lower impurity concentration than the first film 61g. This impurity includes boron.

However, the embodiments are not limited thereto as long as the etching rate of the second film 62g is different from the etching rate of the first film 61g. The combination of the first film 61g and the second film 62g is arbitrary.

The embodiments provide a nonvolatile semiconductor memory device and a method for manufacturing the same capable of reducing the number of manufacturing steps.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

The embodiments of the invention have been described above with reference to examples. However, the embodiments of the invention are not limited to these examples. For instance, various specific configurations of the components such as the stacked body, electrode film, interelectrode insulating film, charge retention film, memory film, connecting portion, dividing portion, substrate, and wiring included in the nonvolatile semiconductor memory device are encompassed within the scope of the invention as long as those skilled in the art can similarly practice the invention and achieve similar effects by suitably selecting such configurations from conventionally known ones.

Further, any two or more components of the specific examples may be combined within the extent of technical feasibility and are included in the scope of the embodiments to the extent that the spirit of the embodiments is included.

Furthermore, those skilled in the art can suitably modify and implement the nonvolatile semiconductor memory device and the method for manufacturing the same described above in the embodiments of the invention. All the nonvolatile semiconductor memory devices and the methods for manufacturing the same thus modified are also encompassed within the scope of the invention as long as they fall within the spirit of the invention.

Furthermore, various modifications and alterations within the spirit of the invention will be readily apparent to those skilled in the art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
 a first stacked body including a plurality of first electrode films stacked along a first axis and a first interelectrode insulating film provided between two layers of the first electrode films neighboring along the first axis;
 a first semiconductor pillar penetrating through the first stacked body along the first axis;
 a second stacked body juxtaposed with the first stacked body along a second axis orthogonal to the first axis and including a plurality of second electrode films stacked along the first axis and a second interelectrode insulating film provided between two layers of the second electrode films neighboring along the first axis;
 a second semiconductor pillar penetrating through the second stacked body along the first axis;
 a connecting portion electrically connecting the first semiconductor pillar and the second semiconductor pillar;
 a first memory film provided between the first electrode films and the first semiconductor pillar and between the second electrode films and the second semiconductor pillar;
 a dividing portion electrically dividing the first electrode films and the second electrode films from each other between the first semiconductor pillar and the second semiconductor pillar, the dividing portion being in contact with the connecting portion, and including a stacked film including a material used for the first memory film;
 a third semiconductor pillar juxtaposed with the first semiconductor pillar along a third axis perpendicular to the first axis and the second axis and penetrating through the first stacked body along the first axis;
 a fourth semiconductor pillar juxtaposed with the third semiconductor pillar along the second axis, juxtaposed with the second semiconductor pillar along the third axis, and penetrating through the second stacked body along the first axis;
 a second connecting portion electrically connecting the third semiconductor pillar and the fourth semiconductor pillar; and
 a second memory film provided between the first electrode films and the third semiconductor pillar and between the second electrode films and the fourth semiconductor pillar,
 the dividing portion further electrically dividing the first electrode films and the second electrode films from each other between the third semiconductor pillar and the fourth semiconductor pillar,
 the dividing portion including:
 a first portion provided between the first semiconductor pillar and the second semiconductor pillar;
 a second portion provided between the third semiconductor pillar and the fourth semiconductor pillar; and
 a third portion provided between the first portion and the second portion,
 a thickness along the second axis of the third portion being different from a thickness along the second axis of the first portion, and different from a thickness along the second axis of the second portion, and
 the third portion including a layer including a material used for the first semiconductor pillar.

2. The device according to claim 1, wherein
the first memory film includes a charge retention film, and
the stacked film included in the dividing portion includes a film including a material used for the charge retention film.

3. The device according to claim 1, wherein the stacked film included in the dividing portion includes a silicon oxide film and a silicon nitride film.

4. The device according to claim 1, wherein a thickness along the first axis of the interelectrode insulating film is twice or less of a thickness along the second axis of the first memory film.

5. The device according to claim 1, wherein a thickness along the second axis of the dividing portion is smaller than twice of a thickness along the second axis of the first memory film.

6. The device according to claim 1, wherein a thickness along the second axis of the dividing portion is varied along a third axis orthogonal to the first axis and the second axis.

7. The device according to claim 1, wherein the first memory film includes:

an inner insulating film provided around the first semiconductor pillar, the second semiconductor pillar, and the connecting portion;
a charge retention layer provided around the inner insulating film; and
an outer insulating film provided around the charge retention layer.

8. The device according to claim 1, wherein the thickness along the second axis of the third portion is thicker than the thickness along the second axis of the first portion, and thicker than the thickness along the second axis of the second portion.

9. The device according to claim 1, wherein the second portion is continuous to the third portion along the third axis.

* * * * *